United States Patent
Wu et al.

(10) Patent No.: US 9,985,648 B1
(45) Date of Patent: May 29, 2018

(54) METHODS FOR ACCELERATING HASH-BASED COMPRESSION AND APPARATUSES USING THE SAME

(71) Applicant: Shanghai Zhaoxin Semiconductor Co., Ltd., Shanghai (CN)

(72) Inventors: Fangfang Wu, Beijing (CN); Xiaoyang Li, Beijing (CN); Zongpu Qi, Beijing (CN); Di Hu, Beijing (CN); Jin Yu, Shanghai (CN); Zheng Wang, Beijing (CN)

(73) Assignee: SHANGHAI ZHAOXIN SEMICONDUCTOR CO., LTD., Shanghai (CN)

( * ) Notice: Subject to any disclaimer, the term of this patent is extended or adjusted under 35 U.S.C. 154(b) by 0 days. days.

(21) Appl. No.: 15/797,384

(22) Filed: Oct. 30, 2017

(30) Foreign Application Priority Data

May 24, 2017 (CN) .......................... 2017 1 0372812

(51) Int. Cl.
*H03M 7/30* (2006.01)

(52) U.S. Cl.
CPC ................................ *H03M 7/3086* (2013.01)

(58) Field of Classification Search
None
See application file for complete search history.

(56) References Cited

U.S. PATENT DOCUMENTS

| | | | | |
|---|---|---|---|---|
| 5,525,982 A | * | 6/1996 | Cheng ................ | H03M 7/3086 341/51 |
| 6,529,912 B2 | * | 3/2003 | Satoh ................. | H03M 7/3084 707/693 |
| 2017/0295263 A1 | * | 10/2017 | Francis .............. | H04L 69/04 |

* cited by examiner

*Primary Examiner* — Howard Williams
(74) *Attorney, Agent, or Firm* — McClure, Qualey & Rodack, LLP

(57) ABSTRACT

The invention introduces a method for accelerating compression, performed in a compression accelerator, including: repeatedly executing a loop for determining the longest matched-length between a first string and a second string. Each iteration of the loop includes: obtaining n successive characters from the first string as a source string, wherein n is greater than 1; comparing each character of the source string with all characters of the second string, so as to generate n first-match-results corresponding to the n successive characters of the source string respectively; generating a second-match-result according to the n first-match-results; and determining whether a continuous match of the n successive characters is presented according to the second-match-result. If so, n is added to the matched length and the next iteration of the loop is continued to execute. Otherwise, a matched length is updated and output and the loop is exited.

20 Claims, 19 Drawing Sheets

METHODS FOR ACCELERATING HASH-BASED COMPRESSION AND APPARATUSES USING THE SAME

CROSS REFERENCE TO RELATED APPLICATIONS

This application claims the benefit of China Patent Application No. 201710372812.2, filed on May 24, 2017, the entirety of which is incorporated by reference herein.

BACKGROUND

Technical Field

The present invention relates to a microprocessor, and in particular, to methods for accelerating hash-based compression and apparatuses using the same.

Description of the Related Art

The most complicated technology of a compression accelerator is LSM (longest-prefix string matching). LSM methods can be categorized into those that are CAM (Content addressable Memory)-based and those that are hash-based. Hash-based string matching is usually optimized by reducing hash chains and/or using a lower-conflict hash function, whose optimization is conventionally realized in the software domain. However, the performance of software is typically worse than that of dedicated hardware. Therefore, what is needed are methods for accelerating hash-based compression performed by dedicated hardware and apparatuses using the same to overcome the aforementioned drawbacks.

BRIEF SUMMARY

An embodiment of the invention introduces a method for accelerating compression, performed in a compression accelerator, at least includes: repeatedly executing a loop for determining a longest matched-length between a first string and a second string. Each iteration of the loop at least includes: obtaining n successive characters from the first string as a source string, wherein n is greater than 1; comparing each character of the source string with all characters of the second string, so as to generate n first-match-results corresponding to the n successive characters of the source string respectively; generating a second-match-result according to the n first-match-results; determining whether a continuous match of the n successive characters is presented according to the second-match-result; when the continuous match of the n successive characters is not presented, updating and outputting a matched length and breaking the loop; and when the continuous match of the n successive characters is presented, adding n to the matched length and continuing to execute the next iteration of the loop.

An embodiment of the invention introduces an apparatus for accelerating compression, at least including a sliding window buffer; a lookahead buffer; n string comparators; a shifter-and-comparator; an outcome inspector; and a controller. The sliding window buffer latches a second string. The lookahead buffer latches n successive characters from the first string as a source string. The n string comparators compares each character of the source string with all characters of the second string, so as to generate n first-match-results corresponding to the n successive characters of the source string respectively, wherein n is greater than 1. The shifter-and-comparator generates a second-match-result according to the n first-match-results. The outcome inspector determines whether a continuous match of the n successive characters is presented according to the second-match-result. The controller updates and outputs a matched length when the continuous match of the n successive characters is not presented, and adds n to the matched length and controls the lookahead buffer to latch the next successive n characters from the first string as a new source string when the continuous match of the n successive characters is presented.

A detailed description is given in the following embodiments with reference to the accompanying drawings.

BRIEF DESCRIPTION OF THE DRAWINGS

The present invention can be fully understood by reading the subsequent detailed description and examples with references made to the accompanying drawings, wherein.

DETAILED DESCRIPTION

The following description is of the best-contemplated mode of carrying out the invention. This description is made for the purpose of illustrating the general principles of the invention and should not be taken in a limiting sense. The scope of the invention is best determined by reference to the appended claims.

The present invention will be described with respect to particular embodiments and with reference to certain drawings, but the invention is not limited thereto and is only limited by the claims. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

Figure 1:
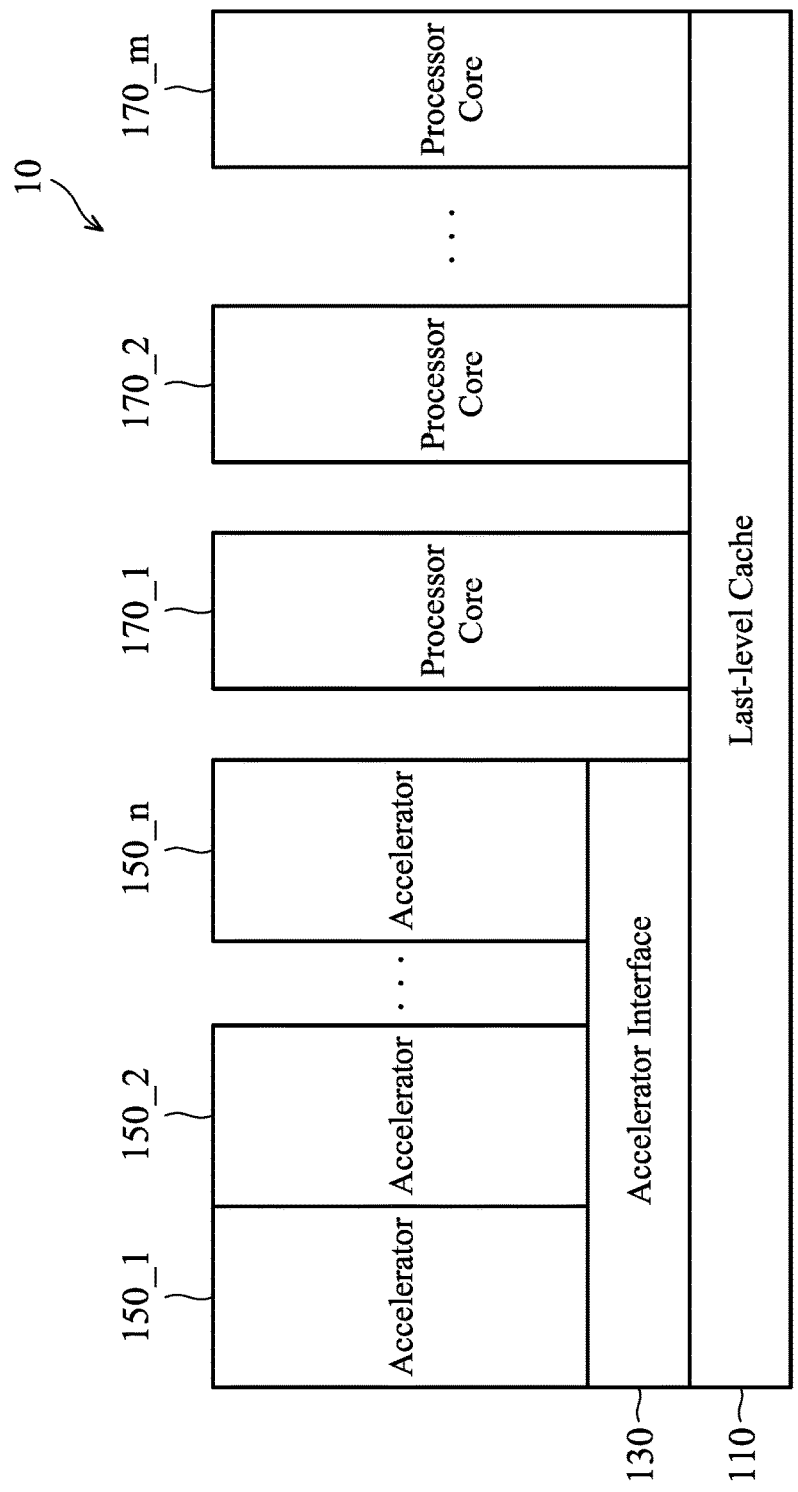
FIG. 1 is a system diagram of a microprocessor according to an embodiment of the invention.

FIG. 1 is a system diagram of a microprocessor according to an embodiment of the invention. A microprocessor 10 may include processor cores 170_1 to 170_j and accelerators 150_1 to 150_i, where i and j are integers and may be set depending on different design requirements. The accelerators 150_1 to 150_i, for example, may be AFUs (Accelerator Functional Units). Components of any of the processor cores 170_1 to 170_j participate in the execution of computer instructions, such as an ALU (Arithmetic Logic Unit), a FPU (Floating Point Unit), a L1 cache and a L2 cache. An instruction cycle (sometimes called a fetch-decode-execute cycle) being the basic operational process is employed in each processor core. It is the process by which a processor core retrieves a program instruction from its memory, determines what operation the instruction indicates, and executes those operations. The accelerators 150_1 to 150_i may perform different functions and connect to a last-level cache 110 via an accelerator interface 130 to exchange data with the processor cores 170_1 to 170_j using virtual addresses. Any of the accelerators 150_1 to 150_i assists the processor cores 170_1 and 170_j to perform designated functions with heavy computation loading more efficiently, such as compression, ciphering/deciphering, regular matching or the like, thereby reducing the workload on the processor cores 170_1 to 170_j. One of the accelerators 150_1 to 150_i is a compression accelerator to complete a string compression.

Figure 2:
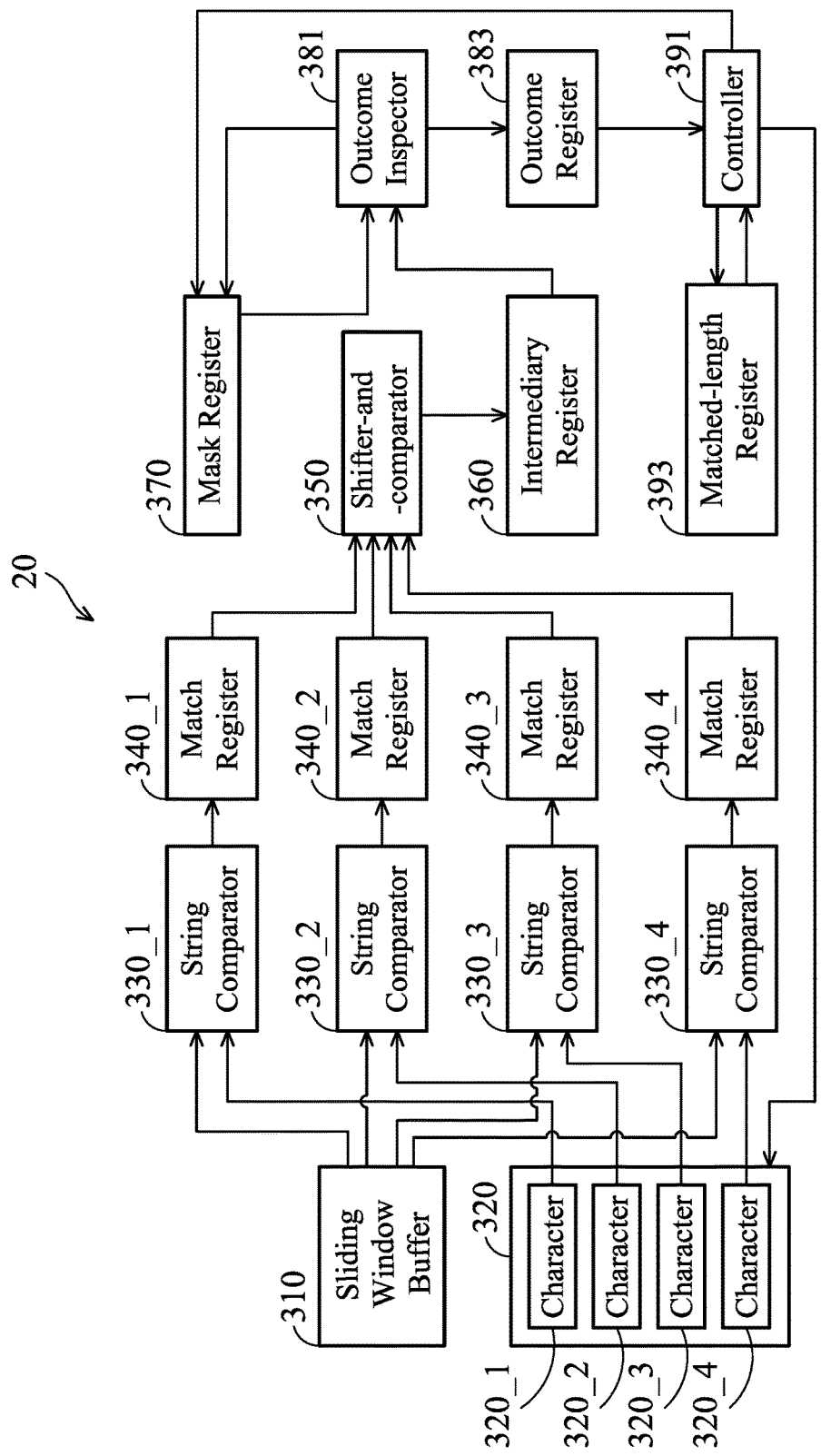
FIG. 2 is a block diagram of a compression accelerator according to an embodiment of the invention.

FIG. 2 is a block diagram of a compression accelerator according to an embodiment of the invention. A compression accelerator 20 includes a sliding window buffer 310, a lookahead buffer 320, a mask register 370 and a matched-length register 393. The compression accelerator 20 includes a controller 391, and, initially, the lookahead buffer 320 latches n characters 320_1 to 320_n, where n may be 4. Although embodiments of the invention describe a design for comparing 4 (n=4) characters in each batch, those skilled in the art may devise the design for comparing more or less characters in each batch depending on different requirements, such as 3, 5 or 6 characters, and the invention should not be limited thereto. In some embodiments, the sliding window buffer 310 may be a vector register of 2048 bits for latching 256 characters of an original string and each character is represented in 8 bits, for example, "a", "b", "c", "d", "e", "f", "a", "b", "c", "d", "e", "f" and so on. It should be noted that, with respect to the order of the original string, original characters of the sliding window buffer 310 are located before the original characters of the lookahead buffer 320 that are to be compressed. In some embodiments, the lookahead buffer 320 may be a vector register of 32 bits for latching 4 characters of an original string and each character is represented in 8 bits, for example, "a", "b", "c" and "d". In some embodiments, the mask register 370 may be a register of 256 bits, and each bit is initiated as a first value, such as "2'b1". In some embodiments, the matched-length register 393 may be a register of 8 bits and initially latches "0". The compression accelerator 20 includes string comparators 330_1 to 330_4, inputs of each string comparator are connected to the lookahead buffer 320 and the sliding window buffer 310 and an output of each string comparator is connected to the designated one of the match registers 340_1 to 340_4. Each of the match registers 340_1 to 340_4 may include 256 registers, in which the $i^{th}$ register latches information indicating whether an input character of the lookahead buffer 320 matches the $i^{th}$ character of the sliding window buffer 310, where i represents an arbitrary integer ranging from 0 to 255. Each string comparator compares one corresponding character of the lookahead buffer 320 with each character of the sliding window buffer 310 and stores a comparison result in the designated one of the match registers 340_1 to 340_4. When the input character of the lookahead buffer 320 matches the $i^{th}$ character of the sliding window buffer 310, the $i^{th}$ register of the corresponding match register is set to the first value, such as "2'b1". Otherwise, the $i^{th}$ register of the corresponding match register is set to a second value, such as "2'b0". Assume that the character 320_1 is "a" and the $0^{th}$ to $9^{th}$ characters are "a", "b", "c", "d", "e", "f", "a", "b", "c", "d", "e", "f": The string comparator 330_1 stores the comparison result "2'b1000010000" in the $0^{th}$ to $9^{th}$ bits of the match register 340_1.

Figure 3:
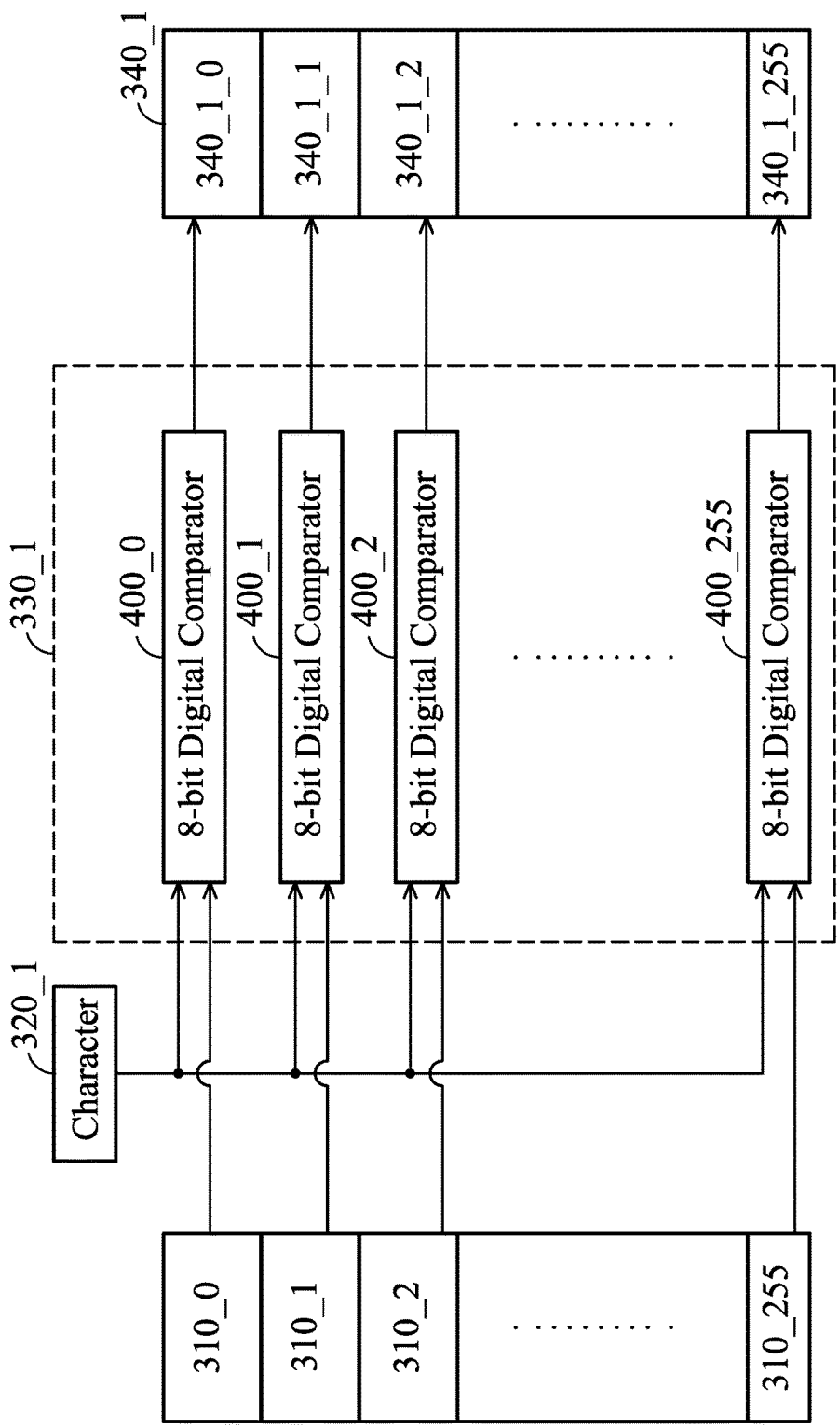
FIG. 3 is the block diagram of a string comparator according to an embodiment of the invention.

FIG. 3 is the block diagram of a string comparator according to an embodiment of the invention. The string comparator 330_1 includes 256 8-bit digital comparators 400_0 to 400_255. The 8-bit digital comparator 400_i compares the character 320_1 with the $i^{th}$ character of the sliding window buffer 310, where i represents an arbitrary integer ranging from 0 to 255. When they match, the 8-bit digital comparator 400_i outputs "2'b1" to the register 340_1_i of the match register 340_1 to latch "2'b1". When they do not match, the 8-bit digital comparator 400_i outputs "2'b0" to the register 340_1_i of the match register 340_1 to latch "2'b0". Those skilled in the art may complete the string comparators 330_2 to 330_4 by devising the string comparator 330_1 and details of the string comparators 330_2 to 330_4 are omitted for brevity.

Figure 4:
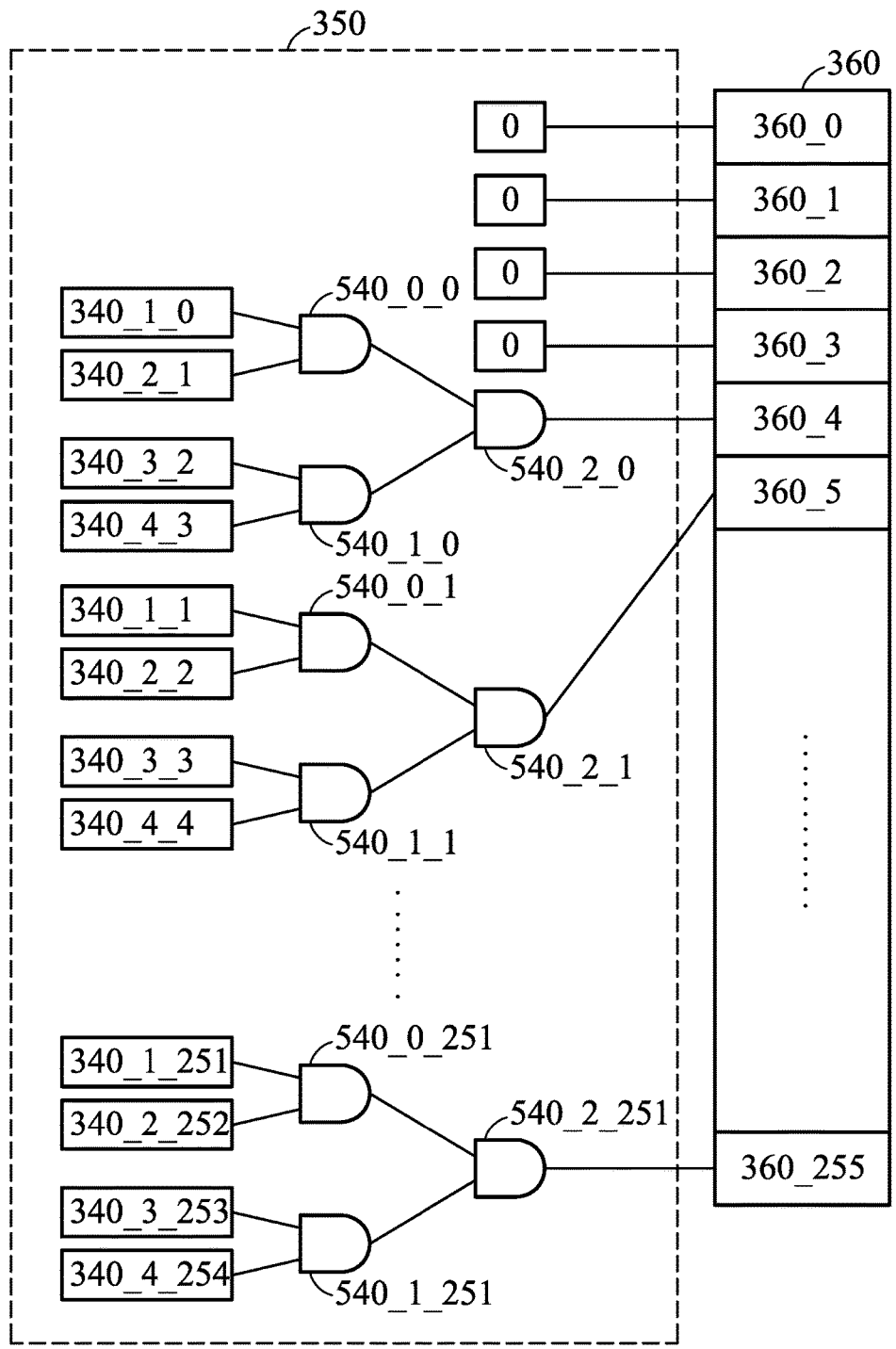
FIG. 4 is the block diagram of a shifter-and-comparator according to an embodiment of the invention.

The compression accelerator 20 includes a shifter-and-comparator 350. FIG. 4 is the block diagram of a shifter-and-comparator according to an embodiment of the invention. The shifter-and-comparator 350 directs registers 360_0 to 360_3 of an intermediary register 360 to latch "2'b0", right shifts the values of the match registers 340_1, 340_2, 340_3 and 340_4 by 4 bits, 3 bits, 2 bits and 1 bit, respectively, performs the logic AND operation on the shifted results bitwise and directs the registers 360_4 to 360_255 of the intermediary register 360 to latch the AND results. Right shifting 4 bits includes operations wherein a value is moved from the LSB (Least Significant Bit) to the MSB (Most Significant Bit) by 4 bits and the least 4 bits of the moved value are filled with "2'b0". Right shifting 3 bits includes operations wherein a value is moved from the LSB to the MSB by 3 bits and the least 3 bits of the moved value are filled with "2'b0". Operations of right shifting 2 or 1 bit can be deduced by analogy and are omitted for brevity. When the register 360_j of the intermediary register 360 is "2'b1", it means that the $(j-4)^{th}$ to $(j-1)^{th}$ characters match all characters of the lookahead buffer 320, where j represents an arbitrary integer ranging from 4 to 255. For example, the shifter-and-comparator 350 may include 756 AND gates 540_0_0 to 540_0_251, 540_1_0 to 540_1_251 and 540_2_0 to 540_2_251. The AND gate 540_0_i performs a logic AND function on the value of the register 340_1_i of the match register 340_1 and the value of the register 340_2_(i+1) of the match register 340_2 and outputs the result to the AND gate 540_2_i, the AND gate 540_1_i performs a logic AND function on the value of the register 340_3_(i+2) of the match register 340_3 and the value of the register 340_4_(i+3) of the match register 340_4 and outputs the result to the AND gate 540_2_i and the AND gate 540_2_i performs a logic AND function on the outputs of the AND gates 540_0_i and 540_1_i and outputs the result to the register 360_(i+4) of the intermediary register 360, where i represents an arbitrary integer ranging from 0 to 251. Apparently, the shifter-and-comparator 350 may implement similar but different logic circuits, such as two NAND gates etc., to realize logic AND functions on the i bit of the match register 340_1 (the value of the register 340_1_i), the (i+1) bit of the match register 340_2 (the value of the register 340_2_(i+1)), the (i+2) bit of the match register 340_3 (the value of the register 340_3_(i+2)) and the (i+3) bit of the match register 340_4 (the value of the register 340_4_(i+3)) and output the result to the (i+4) bit of the intermediary register 360. The invention should not be limited to the implementation of 756 AND gates 540_0_0 to 540_0_251, 540_1_0 to 540_1_251 and 540_2_0 to 540_2_251 as shown in FIG. 4.

Figure 5:
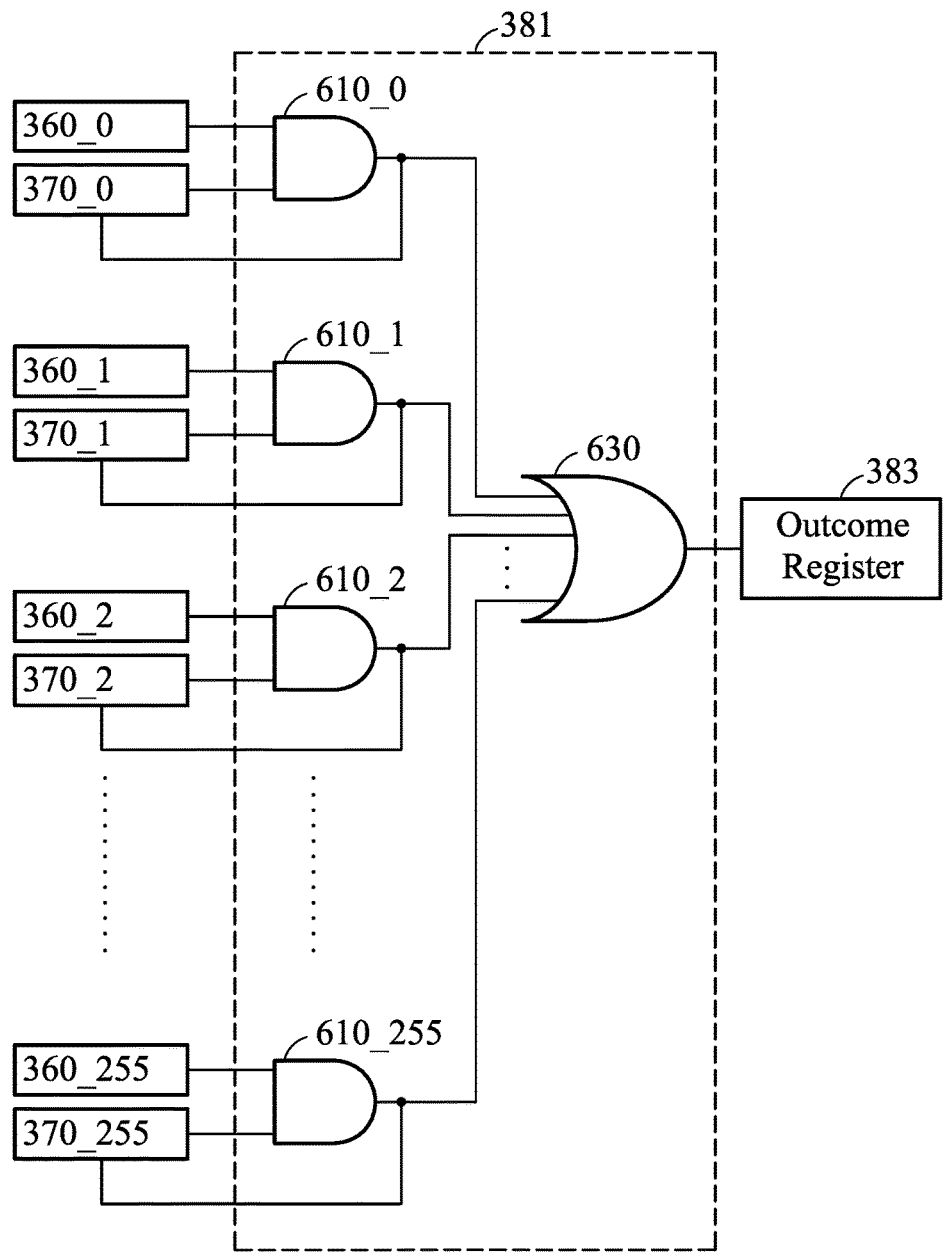
FIG. 5 is the block diagram of an outcome inspector according to an embodiment of the invention.

The compression accelerator 20 includes an outcome inspector 381 and a controller 391. When the value of the matched-length register 393 is greater than or equals 4, the controller 391 right shifts the value of the mask register 370 by 4 bits. The outcome inspector 381 performs a bitwise logic AND function on the (shifted) mask and the value of the intermediary register 360, updates the logical conjunction result with the value of the mask register 370 and inspects whether the logical conjunction result includes at least one bit of "2'b1". FIG. 5 is the block diagram of an outcome inspector according to an embodiment of the invention. The outcome inspector 381 may include 256 logic AND gates 610_0 to 610_255 and a multi-in-single-out OR gate 630. The AND gate 610_i performs a logic AND function on the value of the register 360_1 of the intermediary register 360 and the value of the register 370_i of the mask register 370, outputs the result to the register 370_i to latch the result and outputs the result to the multi-in-single-out OR gate 630, where i represents an arbitrary integer ranging from 0 to 251. The multi-in-single-out OR gate 630 may include OR gates organized in a tree-like structure, performs a logic OR function on the outputs of the AND gates 610_0 to 610_255 and outputs the result to an outcome register 383. When at least one input is "2'b1", the multi-in-single-out OR gate 630 outputs "2'b1". When all inputs are "2'b0", the multi-in-single-out OR gate 630 outputs "2'b0". When the value latched in the outcome register 383 is "2'b0", the controller 391 outputs the value of the matched-length register 393 as a match length. When the value latched in the outcome register 383 is "2'b1", the controller 391 increases the value of the matched-length register 393 by 4 and controls the lookahead buffer 320 to latch 4 characters of the original string after the source string cached in the lookahead buffer 320 that is used to be compared in this iteration.

Figure 6:
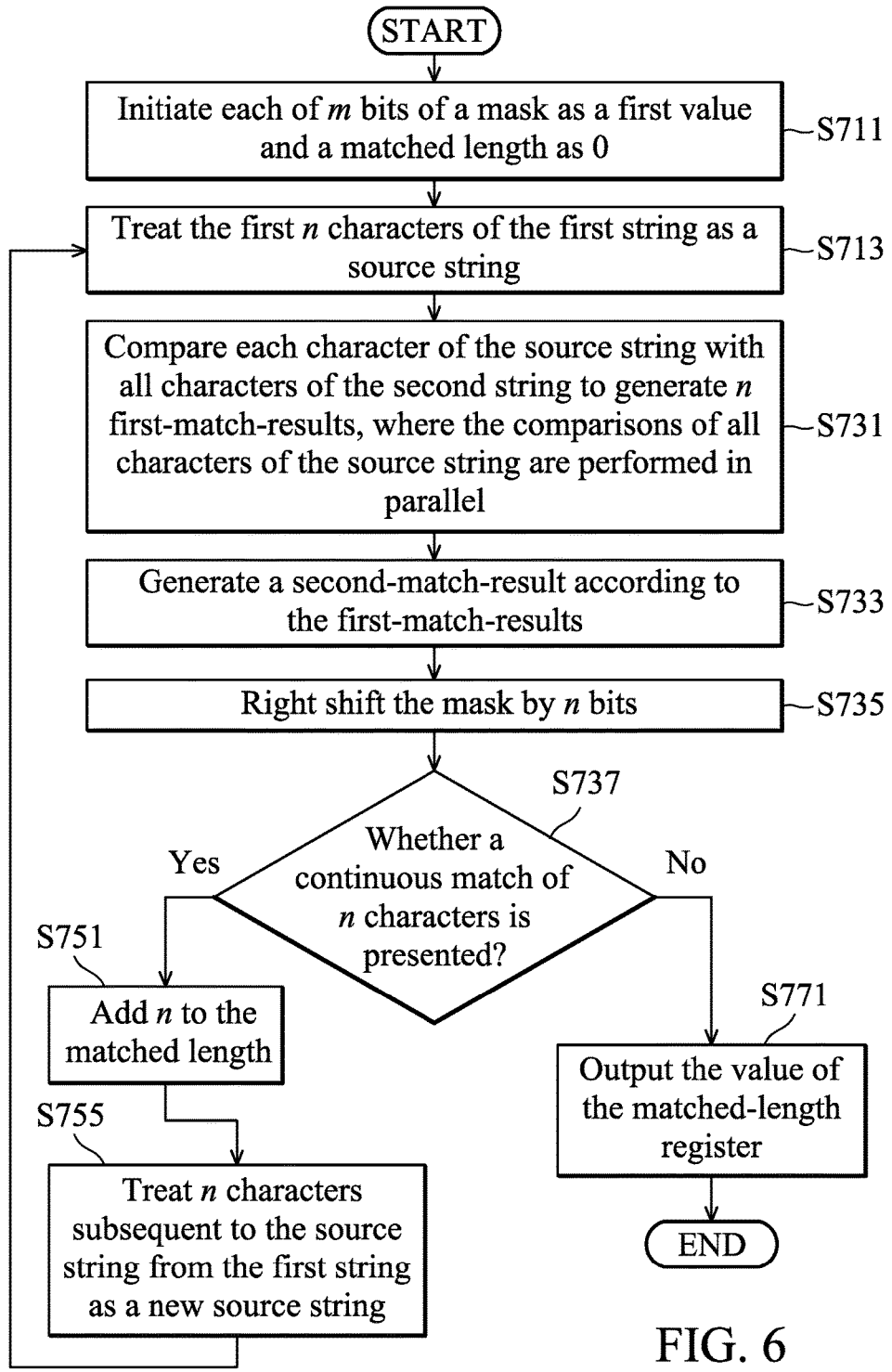
FIG. 6 is a flowchart of a method for accelerating compression according to an embodiment of the invention.

FIG. 6 is a flowchart of a method for accelerating compression according to an embodiment of the invention. The method is executed by using the compression accelerator 20 as shown in FIG. 2 for obtaining the longest matched-length between two strings (i.e., a first string and a second string). Each of m bits of a mask is initiated as a first value, such as "2'b1", and a matched length is initiated as 0, where m may be 256 (step S711) and the first n characters of the first string are treated as a source string (step S713). The initial mask may be latched in the mask register 370, the initial matched length may be latched in the matched-length register 393 and the source string may be latched in the lookahead buffer 320. Subsequently, a loop is repeatedly executed to obtain the longest matched-length between the first and second strings (steps S713 to S771). In each iteration, it is determined whether a continuous match of n characters between the first and second strings is presented. If so, the next iteration is performed. Otherwise, a matched-length is output. Specifically, in each iteration, each character of the source string is compared with all characters of the second string to generate n first-match-results corresponding to the n successive characters of the source string respectively, where the comparisons of all characters of the source string are performed in parallel (step S731). In an embodiment, the comparisons for generating the n first-match-results are realized by pipelined hardware operated in parallel. Next, a second-match-result storing information indicating whether the source string is entirely included in the second string is generated according to the first-match-results (step S733) and the mask is right shifted by n bits to indicate a sequential position next to the ending position of the continuous match that is expected to end in this iteration (step S735). It should be noted that, if the continuous match of n characters is presented in the comparisons of the last iteration, then, in the mask, the value of the bit sequentially next to the ending position of the continuous match is "2'b1". The purpose of right shifting the mask by n bits is to move the "2'b1" of the bit sequentially next to the ending position of the continuous match in the last iteration to a position that is sequentially next to the ending position of a further continuous match in this iteration. Subsequently, it is determined whether a continuous match of n characters is presented according to the second-match-result after being applied by the shifted mask (step S737). The second string may be latched in the sliding window buffer 310. Step S731 may be realized by using the string comparators 330_1 to 330_4 and the first-match-results may be latched in the match registers 340_1 to 340_4. Step S733 may be realized by using the shifter-and-comparator 350 and the second-match-result may be latched in the intermediary register 360. Step S737 may be realized by using the outcome inspector 381 and the inspection result may be latched in outcome register 383. In step S737, the mask latched in the mask register 370 is updated with the newly applied second-match-result. When the continuous match of n characters is absent (the "No" path of step S737), the matched length is output (step S771). When the continuous match of n characters is presented (the "Yes" path of step S737), n is added to the matched length (step S751) and n characters subsequent to the source string from the first string are treated as a new source string (step S755). Steps S751 and S755 may be realized by using the controller 391. The new source string may be latched in the lookahead buffer 320.

Figure 7A:
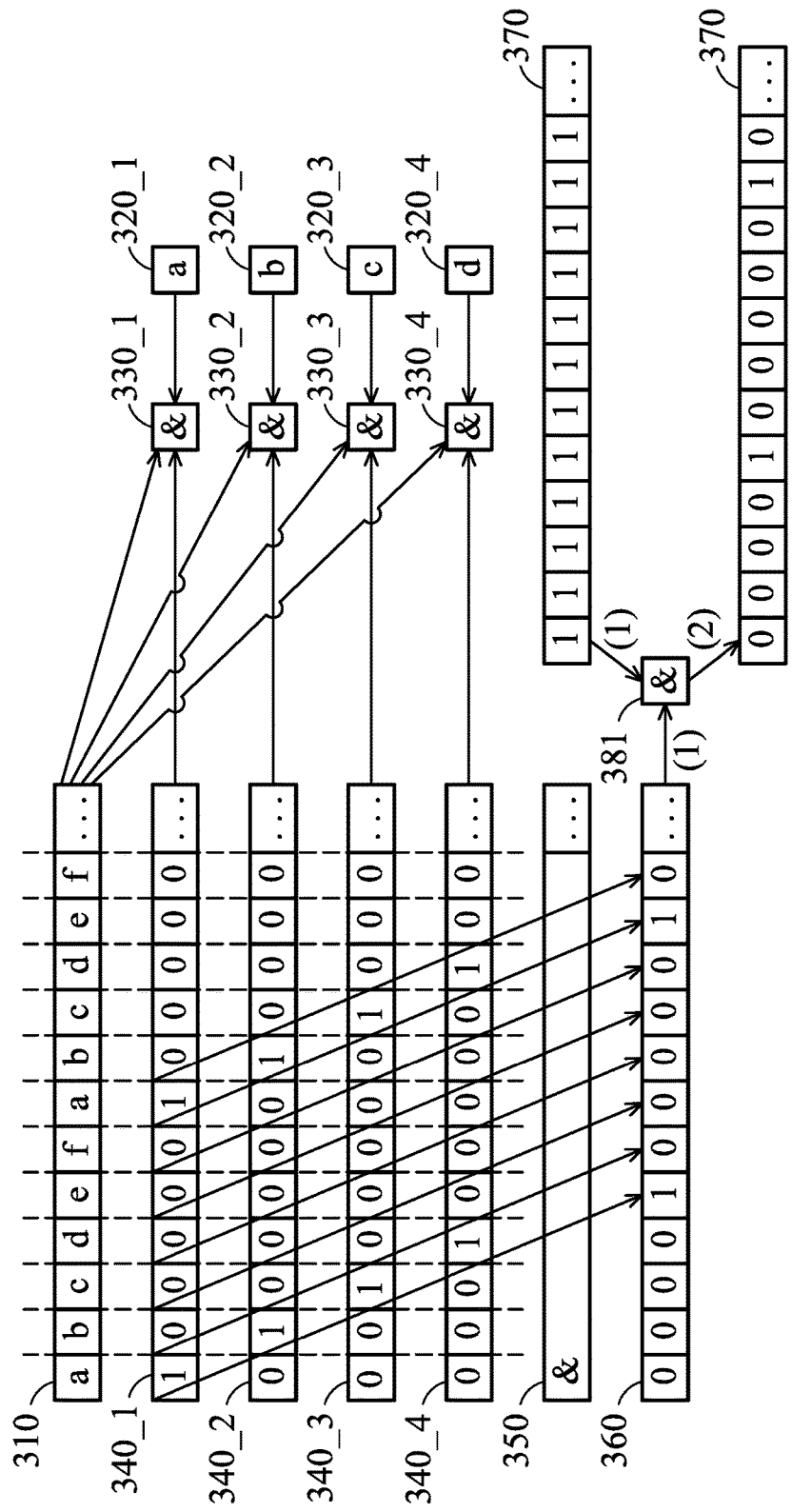
FIGS. 7A-7B are schematic diagrams for calculating a LSM (longest-prefix string matching) according to an embodiment of the invention.
Figure 7B:
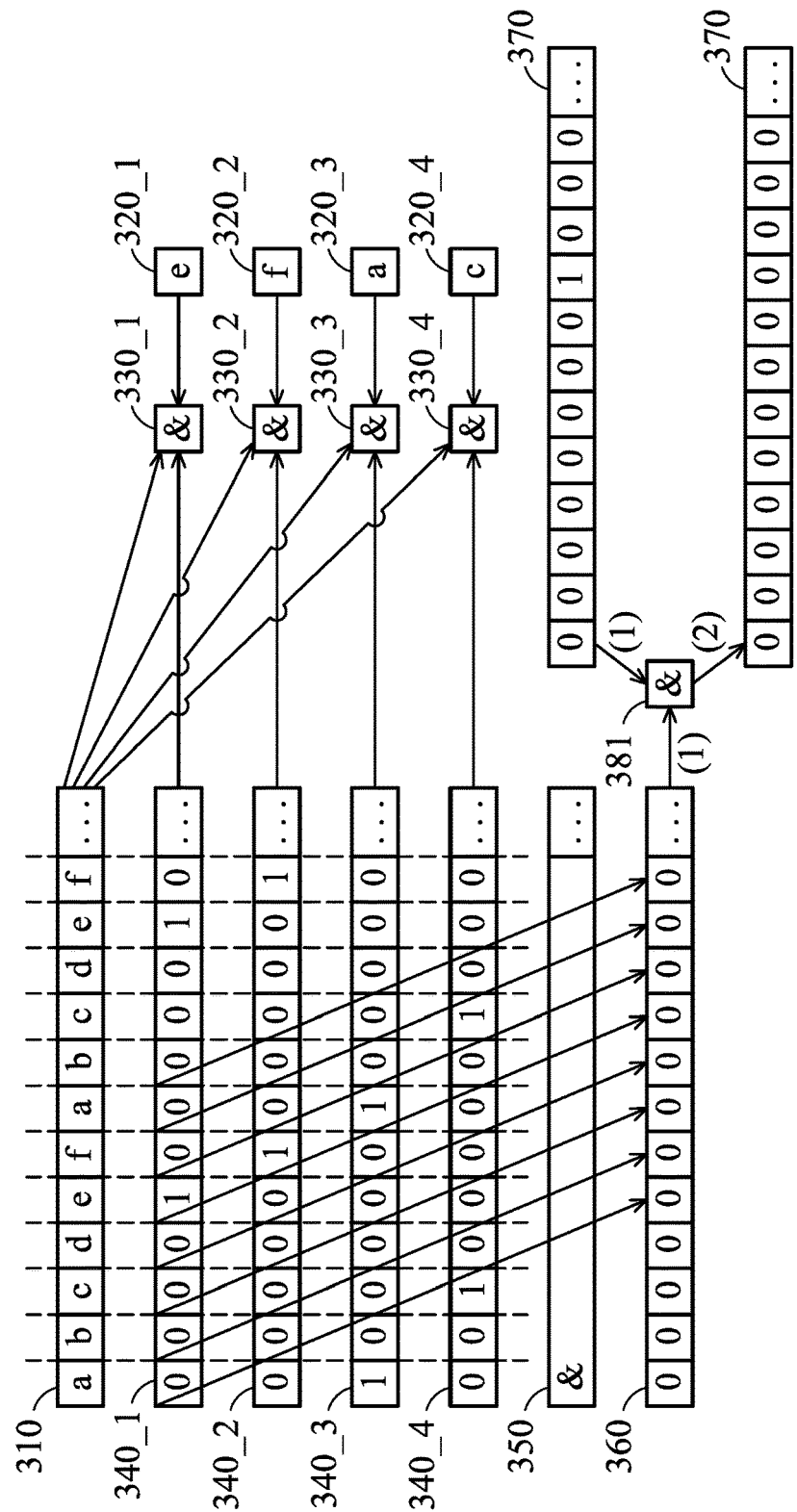

The following examples are introduced to describe the compression accelerator as shown in FIG. 2 and the method for accelerating compression as shown in FIG. 6. FIGS. 7A-7B are schematic diagrams for calculating a LSM (longest-prefix string matching) according to an embodiment of the invention. Assume that a first string includes at least characters "a", "b", "c", "d", "e", "f", "a" and "c" and a second string includes at least characters "a", "b", "c", "d", "e", "f", "a", "b", "c", "d", "e" and "f": Each of m bits of a mask is initiated as "2'b1" and a matched length is initiated as 0 (step S711) and the characters "a", "b", "c" and "d" of the first string are treated as a source string and are latched in the registers 320_1 to 320_4, respectively (step S713). A mask stores information of a position sequentially next to the expected ending position of a continuous match. Refer FIG. 7A. In the first iteration, the string comparator 330_1 compares the source character "a" with all characters of the second string, the string comparator 330_2 compares the source character "b" with all characters of the second string, the string comparator 330_3 compares the source character "c" with all characters of the second string and the string comparator 330_4 compares the source character "d" with all characters of the second string to generate 4 first-match-results (step S731). Specifically, the string comparator 330_1 compares the source character "a" with all characters of the second string to generate and latch a first-match-result "2'b100000100000 . . . " in the match register 340_1. The string comparator 330_2 compares the source character "b" with all characters of the second string to generate and latch a first-match-result "2'b010000010000 . . . " in the match register 340_2. The string comparator 330_3 compares the source character "c" with all characters of the second string to generate and latch a first-match-result "2'b0010000010 00 . . . " in the match register 340_3. The string comparator 330_4 compares the source character "d" with all characters of the second string to generate and latch a first-match-result "2'b000100000100 . . . " in the match register 340_4. Subsequently, the shifter-and-comparator 350 generates a second-match-result according to the first-match-results (step S733). Specifically, the shifter-and-comparator 350 performs a bitwise logic AND function according to the shifted values of the match registers 340_1, 340_2, 340_3 and 340_4 and latches the calculation result "2'b000010000010 . . . " in the registers 360_0 to 360 (m−1) of the intermediary register 360 as the second-match-result. Subsequently, the mask is right shifted by 4 bits as "2'b000011111111 . . . " to indicate that a position sequentially next to the ending position at which the continuous match is expected to end in this iteration is the 5$^{th}$ position (step S735), the mask is applied to the second-match-result and the applied result "2'b000010000010 . . . " in the mask register 370 and it is determined whether the applied result includes any bit of "2'b 1" (that is, whether a continuous match of 4 characters is presented) (step S737). Since the applied result "2'b000010000010 . . . " includes at least one bit of "2'b1" (the "Yes" path of step S737), the controller 391 updates the value of the matched-length register 393 with 4=0+4 (step S751) and controls the lookahead buffer 320 to latch "e", "f", "a" and "c" in the registers 320_1 to 320_4 (step S755). Refer to FIG. 7B. In the second iteration, the string comparator 330_1 compares the source character "e" with all characters of the second string, the string comparator 330_2 compares the source character "f" with all characters of the second string, the string comparator 330_3 compares the source character "a" with all characters of the second string and the string comparator 330_4 compares the source character "c" with all characters of the second string to generate 4 first-match-results (step S731). Specifically, the string comparator 330_1 compares the source character "e" with all characters of the second string to generate and latch a first-match-result "2'b000010000010 . . . " in the match register 340_1. The string comparator 330_2 compares the source character "f" with all characters of the second string to generate and latch a first-match-result "2'b000001000001 . . . " in the match register 340_2. The string comparator 330_3 compares the source character "a" with all characters of the second string to generate and latch a first-match-result "2'b100000100000 . . . " in the match register 340_3. The string comparator 330_4 compares the source character "c" with all characters of the second string to generate and latch a first-match-result "2'b0010000010 00 . . . " in the match register 340_4. Subsequently, the shifter-and-comparator 350 generates a second-match-result according to the first-match-results (step S733). Specifically, the shifter-and-comparator 350 performs a bitwise logic AND function according to the shifted values of the match registers 340_1, 340_2, 340_3 and 340_4 and latches the calculation result "2'b000000000000 . . . " in the registers 360_0 to 360 (m−1) of the intermediary register 360 as the second-match-result. Subsequently, the mask is right shifted by 4 bits as "2'b000000001000 . . . " to indicate that a position sequentially next to the ending position at which the continuous match is expected to end in this iteration is the 9$^{th}$ position (step S735), the mask is applied to the second-match-result and the applied result "2'b000000000000 . . . " in the mask register 370 and it is determined whether the applied result includes any bit of "2'b1" (step S737). Since the applied result "2'b000000000000 . . . " includes no bit of "2'b1" (the "No" path of step S737), the controller 391 outputs the value of the matched-length register 393 (step S771). It should be understood that the compression accelerator as shown in FIG. 2 with the method for accelerating compression as shown in FIG. 6 are employed to output a matched length of a multiple of n only.

Figure 8A:
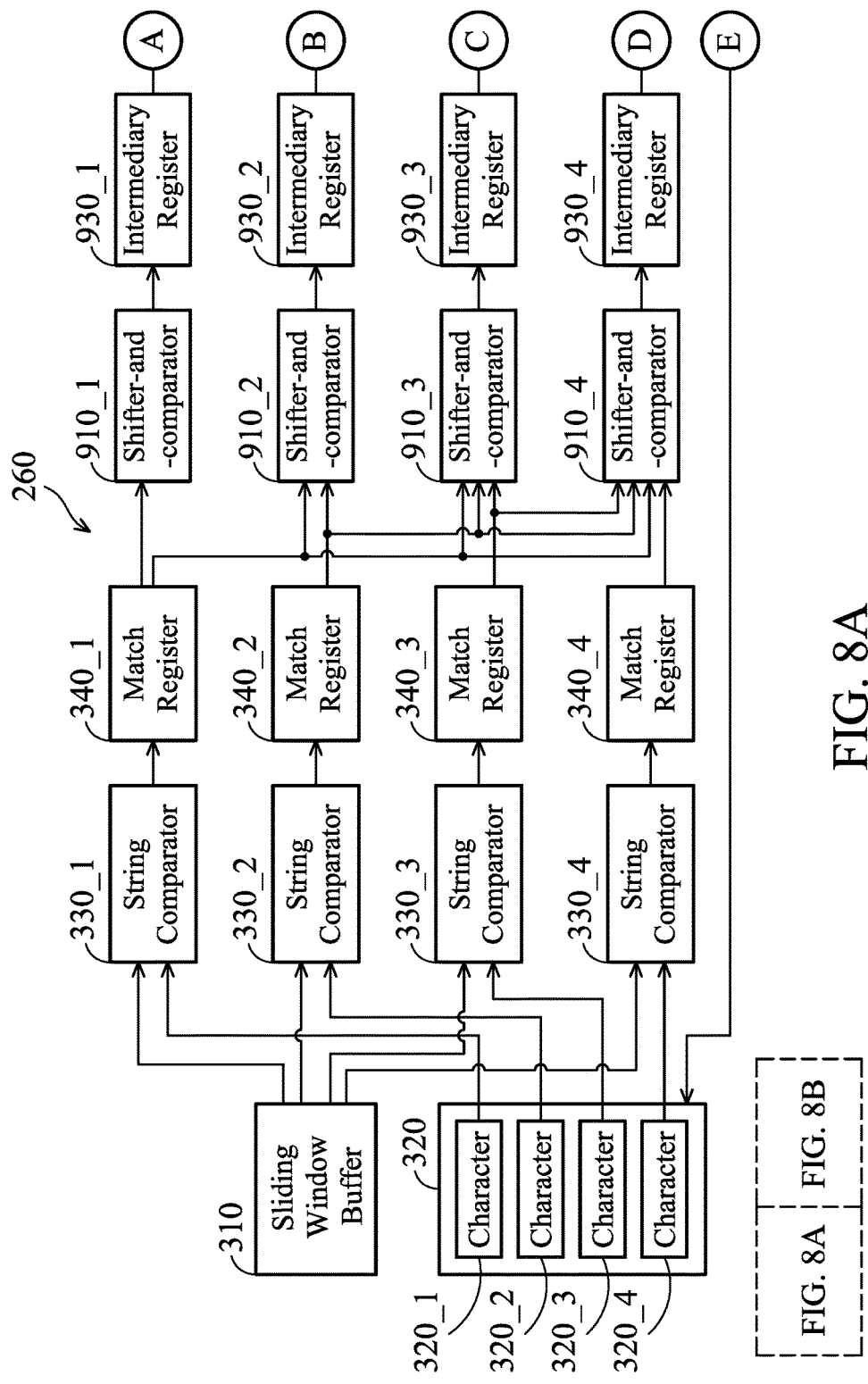
FIGS. 8A and 8B are block diagrams of a compression accelerator according to an embodiment of the invention.
Figure 8B:
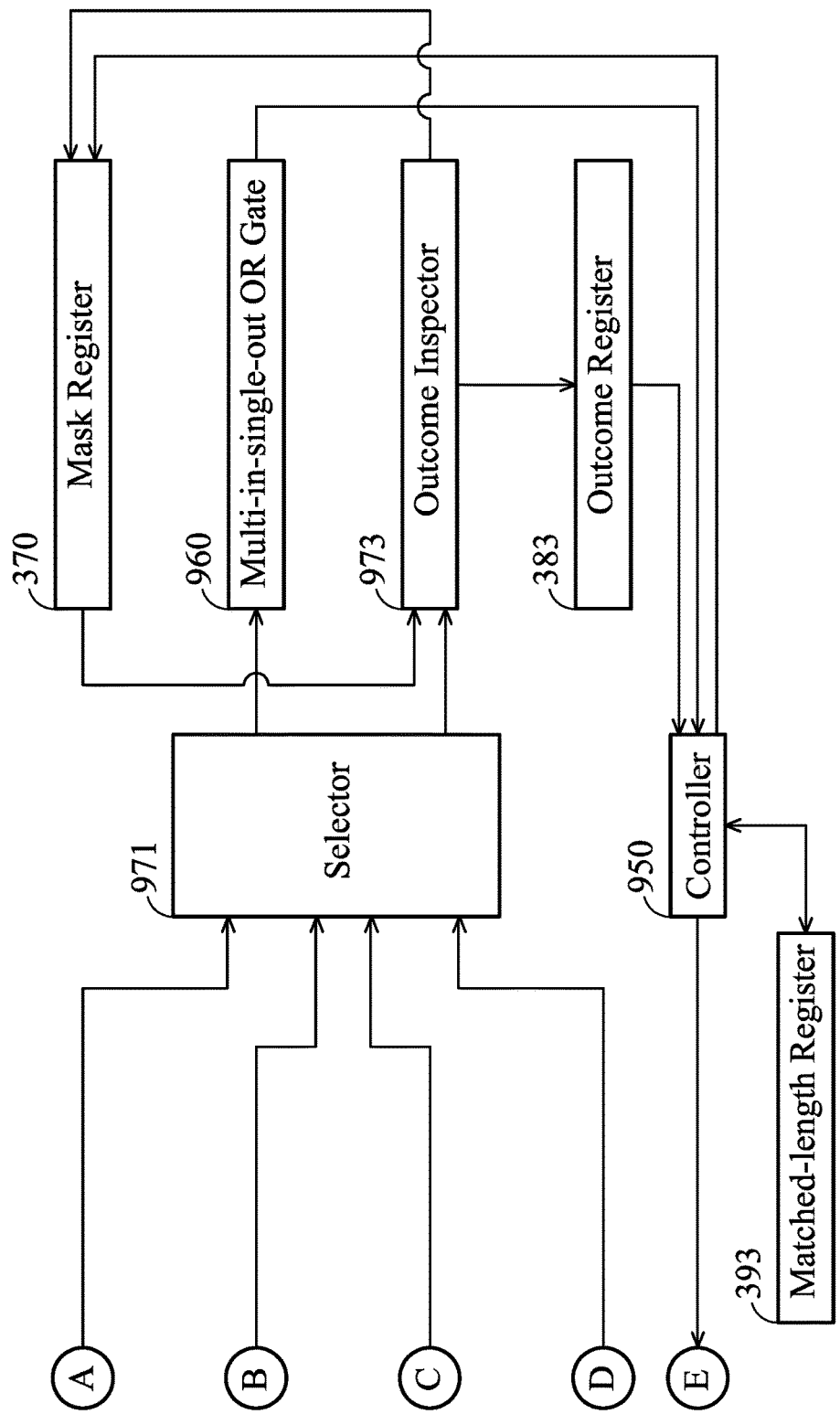

To address the aforementioned drawback, embodiments of the invention further introduce another compression accelerator and another method for accelerating compression. FIGS. 8A and 8B are block diagrams of a compression accelerator according to an embodiment of the invention. Embodiments of the invention additionally include a multi-in-single-out OR gate 960, each input of the multi-in-single-out OR gate 960 is connected to one of the intermediary registers 930_1 to 930_4 (that is, connected to one input of a selector 971). The multi-in-single-out OR gate 960 outputs "2'b1" when one of the intermediary registers 930_1 to 930_4 selected by the selector 971 includes at least one bit of "2'b1". The multi-in-single-out OR gate 960 outputs "2'b0" when one of the intermediary registers 930_1 to 930_4 selected by the selector 971 includes all bits of "2'b0". Initially, the multi-in-single-out OR gate 960 inspects whether all bits of one of the intermediary registers 930_1 to 930_4 latch "2'b0". If so, the controller 950 outputs a value of a matched-length register 393. Otherwise, the controller 950 controls a lookahead buffer 320 to latch n characters 320_1 to 320_n, where n may be 4.

Figure 9A:
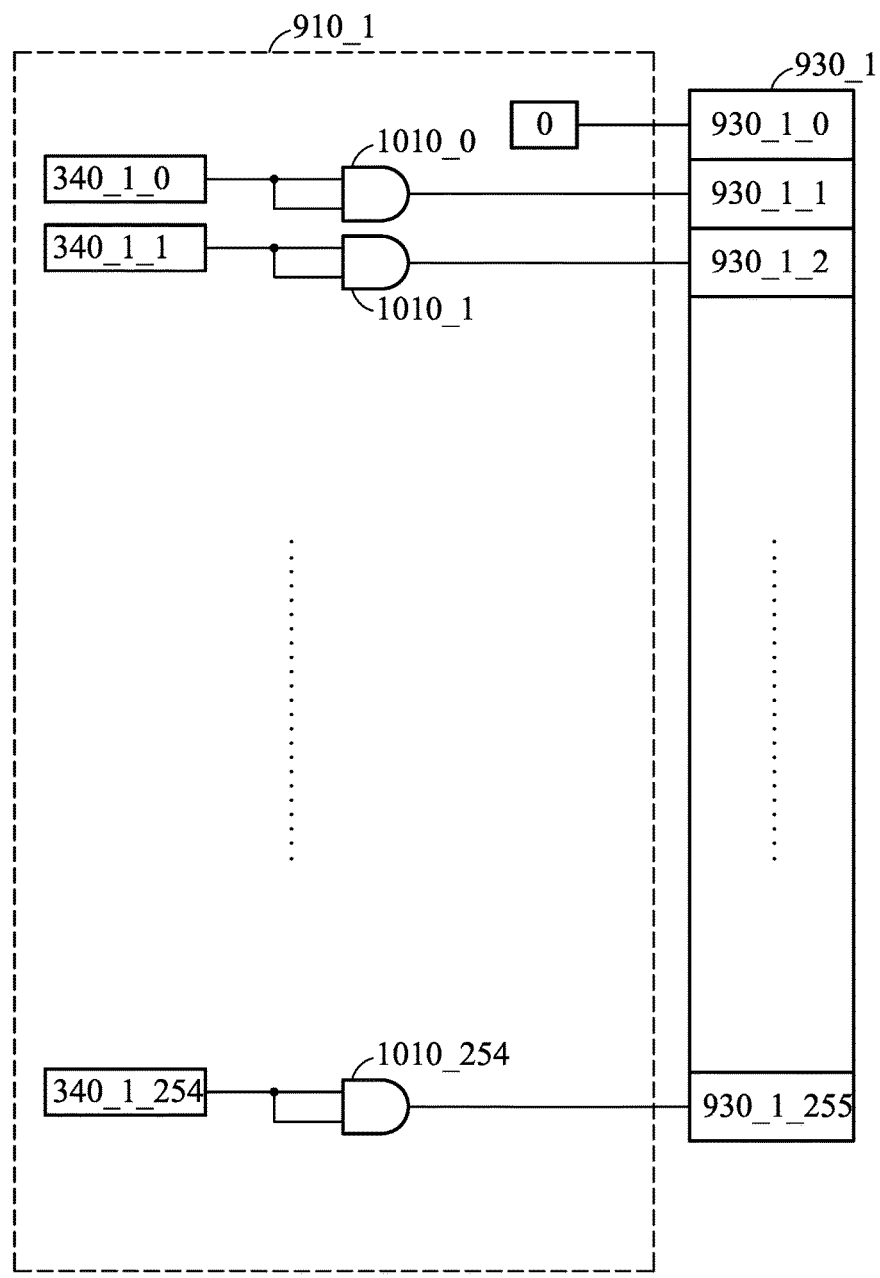
FIG. 9A is the block diagram of a $1^{st}$-stage shifter-and-comparator according to an embodiment of the invention.

The sliding window buffer 310, the lookahead buffer 320, the string comparators 330_1 to 330_4, the match register 340_1 to 340_4, the mask register 370 and the matched-length register 393 as shown in FIG. 2 are also included in the compression accelerator as shown in FIGS. 8A and 8B. In the embodiments of the invention, those skilled in the art may replace the shifter-and-comparator 350 as shown in FIG. 2 with four-stage shifter-and-comparators 910_1 to 910_4 and allocate four intermediary registers 930_1 to 930_4 to connect to the shifter-and-comparators 910_1 to 910_4, respectively. FIG. 9A is the block diagram of a 1$^{st}$-stage shifter-and-comparator according to an embodiment of the invention. The 1$^{st}$-stage shifter-and-comparator 910_1 directs a register 930_1_0 of an intermediary register 930_1 to latch "2'b0", right shifts the value of the match register 340_1 by 1 bit and directs the registers 930_1_1 to 930_1_255 of the intermediary register 930_1 to latch bits of the shifted value of the match register 340_1, respectively. The register 930_1_j of the intermediary register 930_1 being "2'b1" indicates that the (j−1)$^{th}$ character of the sliding window buffer 310 matches the 1$^{st}$ character of the lookahead buffer 320, where j represents an arbitrary integer ranging from 1 to 255. Specifically, the $1^{st}$-stage shifter-and-comparator 910_1 includes 255 logic AND gates 1010_0 to 1010_254. The AND gate 1010_1 performs a logic AND function on the value of the register 340_1_$i$ and the value of the register 340_1_$i$ of the match register 340_1 and outputs the result to the register 930_1_(i+1) of the intermediary register 930_1, where i represents an arbitrary integer ranging from 0 to 254.

Figure 9B:
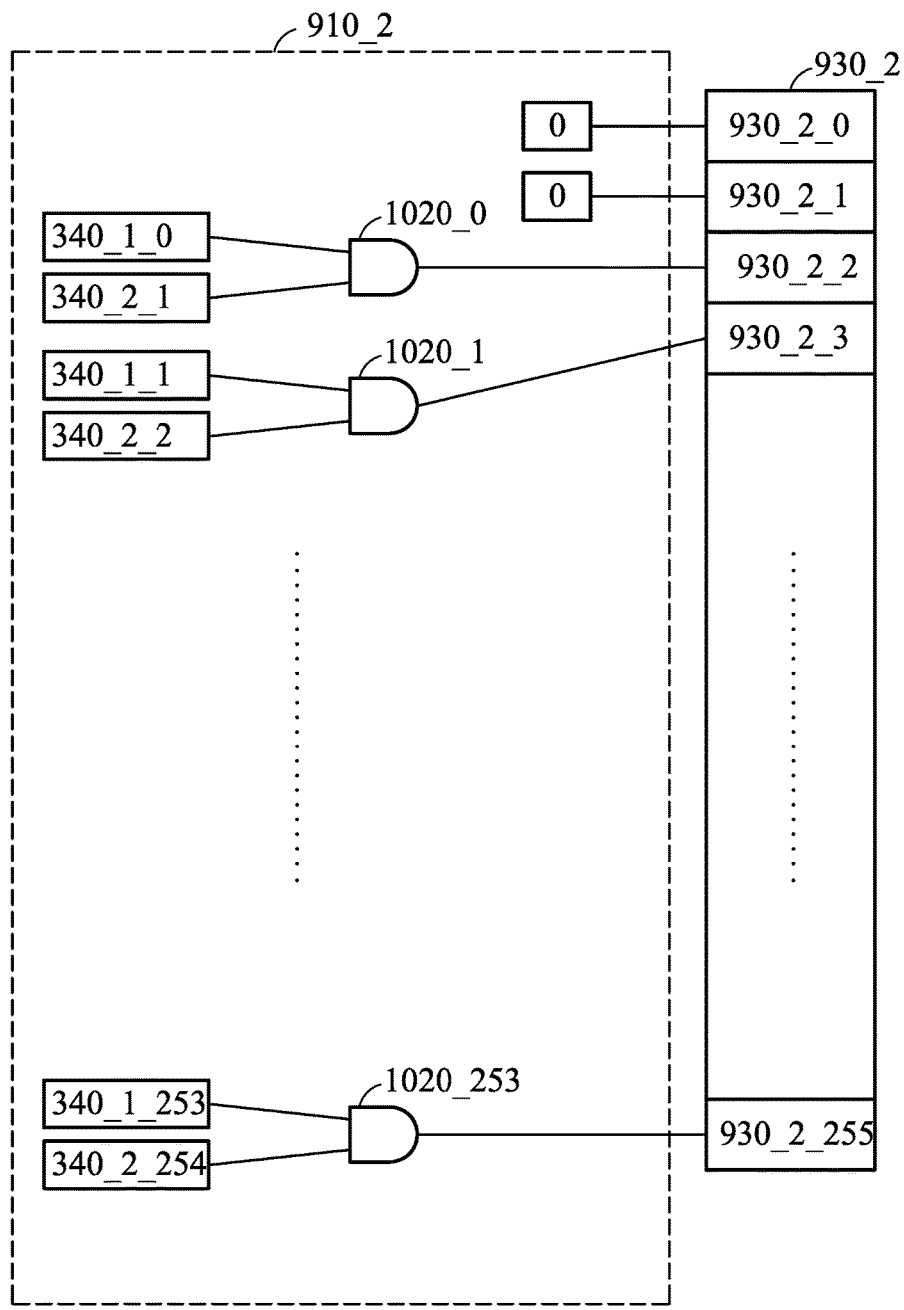
FIG. 9B is the block diagram of a $2^{nd}$-stage shifter-and-comparator according to an embodiment of the invention.

FIG. 9B is the block diagram of a $2^{nd}$-stage shifter-and-comparator according to an embodiment of the invention. The $2^{nd}$-stage shifter-and-comparator 910_2 directs registers 930_2_0 and 930_2_1 of an intermediary register 930_2 to latch "2'b0", right shifts the values of the match registers 340_1 and 340_2 by 2 bits and 1 bit, respectively, performs the logic AND operation on the shifted results bitwise and directs the registers 930_2_2 to 930_2_255 of the intermediary register 930_2 to latch the AND results. The register 930_2_$j$ of the intermediary register 930_2 being "2'b1" indicates that the $(j-2)^{th}$ and $(j-1)^{th}$ characters of the sliding window buffer 310 match the $1^{st}$ and $2^{nd}$ characters of the lookahead buffer 320, where j represents an arbitrary integer ranging from 2 to 255. Specifically, the $2^{nd}$-stage shifter-and-comparator 910_2 includes 254 logic AND gates 1020_0 to 1020_253. The AND gate 1020_1 performs a logic AND function on the value of the register 340_1_$i$ of the match register 340_1 and the value of the register 340_2_(i+1) of the match register 340_2 and outputs the result to the register 930_2_(i+2) of the intermediary register 930_2, where i represents an arbitrary integer ranging from 0 to 253.

Figure 9C:
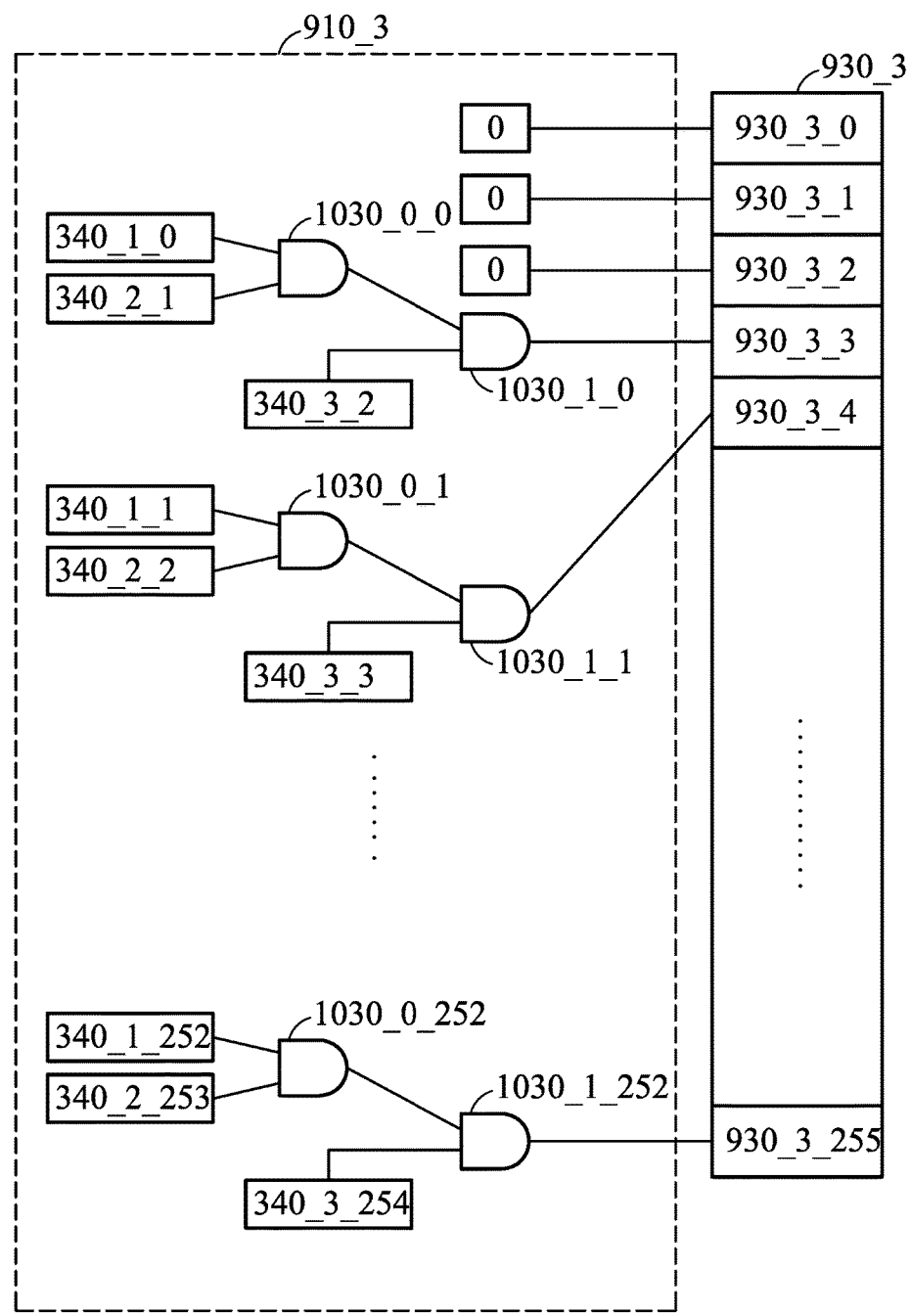
FIG. 9C is the block diagram of a $3^{rd}$-stage shifter-and-comparator according to an embodiment of the invention.

FIG. 9C is the block diagram of a $3^{rd}$-stage shifter-and-comparator according to an embodiment of the invention. The $3^{rd}$-stage shifter-and-comparator 910_3 directs registers 930_3_0 and 930_3_2 of an intermediary register 930_3 to latch "2'b0", right shifts the values of the match registers 340_1, 340_2 and 340_3 by 3 bits, 2 bits and 1 bit, respectively, performs the logic AND operation on the shifted results bitwise and directs the registers 930_3_3 to 930_3_255 of the intermediary register 930_3 to latch the AND results. The register 930_3_$j$ of the intermediary register 930_3 being "2'b1" indicates that the $(j-3)^{th}$ to $(j-1)^{th}$ characters of the sliding window buffer 310 match the $1^{st}$ to $3^{rd}$ characters of the lookahead buffer 320, where j represents an arbitrary integer ranging from 3 to 255. Specifically, the $3^{rd}$-stage shifter-and-comparator 910_3 includes 506 logic AND gates 1030_0_0 to 1030_0_252 and 1030_1_1 to 1030_1_252. The AND gate 1030_0_$i$ performs a logic AND function on the value of the register 340_1_$i$ of the match register 340_1 and the value of the register 340_2_(i+1) of the match register 340_2 and outputs the result to the AND gate 1030_1_$i$, and the AND gate 1030_1_$i$ performs a logic AND function on the value of the register 340_3_(i+2) of the match register 340_3 and the output of the AND gate 1030_0_$i$ and outputs the result to the register 930_3_(i+3) of the intermediary register 930_3, where i represents an arbitrary integer ranging from 0 to 252.

Figure 9D:
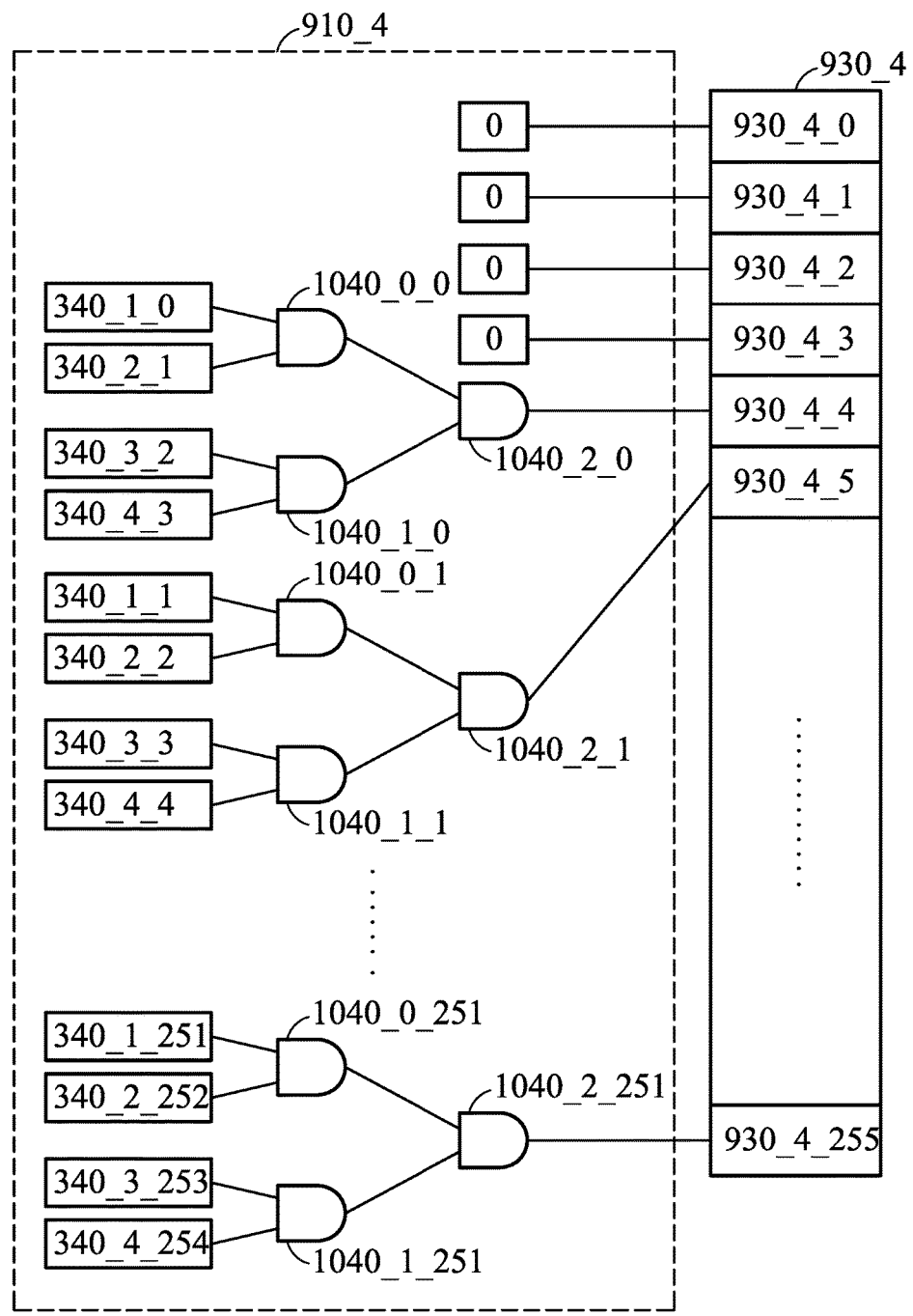
FIG. 9D is the block diagram of a $4^{th}$-stage shifter-and-comparator according to an embodiment of the invention.

FIG. 9D is the block diagram of a $4^{th}$-stage shifter-and-comparator according to an embodiment of the invention. The $4^{th}$-stage shifter-and-comparator 910_4 directs registers 930_4_0 and 930_4_3 of an intermediary register 940_3 to latch "2'b0", right shifts the values of the match registers 340_1, 340_2, 340_3 and 340_3 by 4 bits, 3 bits, 2 bits and 1 bit, respectively, performs the logic AND operation on the shifted results bitwise and directs the registers 930_4_4 to 930_4_255 of the intermediary register 930_4 to latch the AND results. The register 930_4_$j$ of the intermediary register 930_4 being "2'b1" indicates that the $(j-4)^{th}$ to $(j-1)^{th}$ characters of the sliding window buffer 310 match the $1^{st}$ to $4^{th}$ characters of the lookahead buffer 320, where j represents an arbitrary integer ranging from 4 to 255. Specifically, the $4^{th}$-stage shifter-and-comparator 910_4 includes 756 logic AND gates 1040_0_0 to 1040_0_251, 1040_1_0 to 1040_1_251 and 1040_2_0 to 1040_2_251. The AND gate 1040_0_$i$ performs a logic AND function on the value of the register 340_1_$i$ of the match register 340_1 and the value of the register 340_2_(i+1) of the match register 340_2 and outputs the result to the AND gate 1040_2_$i$, the AND gate 1040_1_$i$ performs a logic AND function on the value of the register 340_3_(i+2) of the match register 340_3 and the value of the register 340_4_(i+3) of the match register 340_4 and outputs the result to the AND gate 1040_2_$i$, and the AND gate 1040_2_$i$ performs a logic AND function on the outputs of the AND gates 1040_0_$i$ and 1040_1_$i$ and outputs the result to the register 930_4_(i+4) of the intermediary register 930_4, where i represents an arbitrary integer ranging from 0 to 251.

In the embodiments of the invention, those skilled in the art may replace the outcome inspector 381 as shown in FIG. 2 with the outcome inspector 973 as shown in FIG. 8B. The embodiments of the invention may additionally include the selector 971 to connect one of the intermediary registers 930_1 to 930_4 to one of the multi-in-single-out OR gate 960 and the outcome inspector 973 according to a control signal issued by the controller 950. The controller 950 controls the selector 971 to connect the intermediary register 930_4 to the multi-in-single-out OR gate 960 and inspects whether the intermediary register 930_4 includes at least one "2'b1" through the multi-in-single-out OR gate 960. When the intermediary register 930_4 includes at least one "2'b1", the controller 950 right shifts the value of the mask register 370 by 4 bits and controls the selector 971 to connect the intermediary register 930_4 to the outcome inspector 973. The outcome inspector 973 performs a logic AND function on the shifted value and the value of the intermediary register 930_4 bitwise, updates the value of the mask register 370 with the AND result and inspects whether the AND result includes any bit of "2'b1". When an outcome register 383 latches a value of "2'b1", the controller 950 adds 4 to the matched-length register 393 and controls the lookahead buffer 320 to latch the next four characters.

Subsequently, when all bits of the intermediary register 930_4 are "2'b0", the controller 950 controls the selector 971 to connect the intermediary register 930_3 to the multi-in-single-out OR gate 960 and inspects whether the intermediary register 930_3 includes at least one "2'b1" through the multi-in-single-out OR gate 960. When the intermediary register 930_3 includes at least one "2'b1", the controller 950 right shifts the value of the mask register 370 by 3 bits and controls the selector 971 to connect the intermediary register 930_3 to the outcome inspector 973. The outcome inspector 973 performs a logic AND function on the shifted value and the value of the intermediary register 930_3 bitwise, updates the value of the mask register 370 with the AND result and inspects whether the AND result includes any bit of "2'b1". When the outcome register 383 latches a value of "2'b1", the controller 950 adds 3 to the matched-length register 393 and outputs the value of the matched-length register 393 as the matched length.

Subsequently, when all bits of the intermediary register 930_3 are "2'b0", the controller 950 controls the selector 971 to connect the intermediary register 930_2 to the multi-in-single-out OR gate 960 and inspects whether the intermediary register 930_2 includes at least one "2'b1" through the multi-in-single-out OR gate 960. When the intermediary register 930_2 includes at least one "2'b1", the controller 950 right shifts the value of the mask register 370 by 2 bits and controls the selector 971 to connect the intermediary register 930_2 to the outcome inspector 973. The outcome inspector 973 performs a logic AND function on the shifted value and the value of the intermediary register 930_2 bitwise, updates the value of the mask register 370 with the AND result and inspects whether the AND result includes any bit of "2'b1". When the outcome register 383 latches a value of "2'b1", the controller 950 adds 2 to the matched-length register 393 and outputs the value of the matched-length register 393 as the matched length.

Subsequently, when all bits of the intermediary register 930_2 are "2'b0", the controller 950 controls the selector 971 to connect the intermediary register 930_1 to the multi-in-single-out OR gate 960 and inspects whether the intermediary register 930_1 includes at least one "2'b1" through the multi-in-single-out OR gate 960. When the intermediary register 930_1 includes at least one "2'b1", the controller 950 right shifts the value of the mask register 370 by 1 bit and controls the selector 971 to connect the intermediary register 930_1 to the outcome inspector 973. The outcome inspector 973 performs a logic AND function on the shifted value and the value of the intermediary register 930_1 bitwise, updates the value of the mask register 370 with the AND result and inspects whether the AND result includes any bit of "2'b1". When the outcome register 383 latches a value of "2'b1", the controller 950 adds 1 to the matched-length register 393 and outputs the value of the matched-length register 393 as the matched length. When the outcome register 383 latches a value of "2'b0", the controller 950 directly outputs the value of the matched-length register 393 as the matched length.

Figure 10:
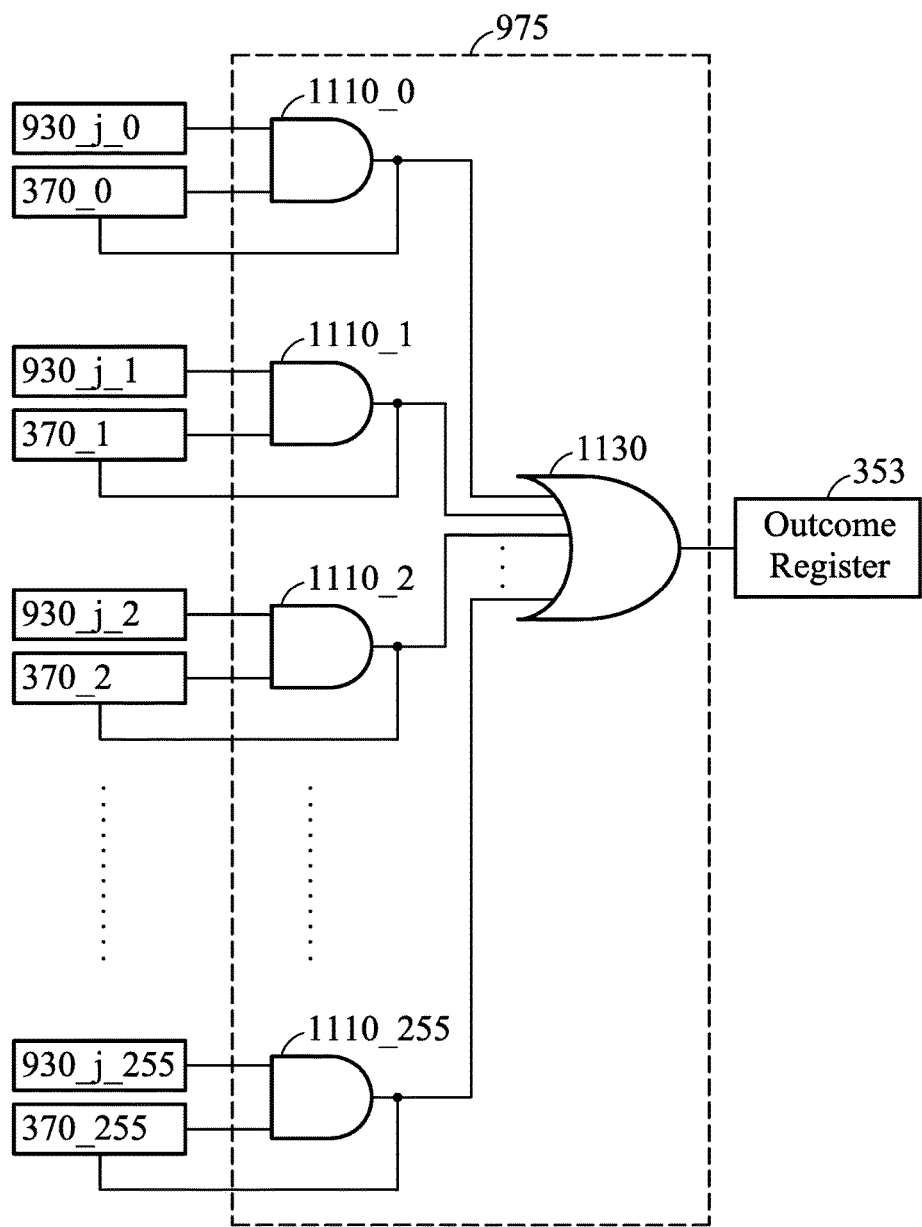
FIG. 10 is the block diagram of an outcome inspector according to an embodiment of the invention.

FIG. 10 is the block diagram of an outcome inspector according to an embodiment of the invention. The outcome inspector 973 may include 256 logic AND gates 1110_0 to 1110_255 and a multi-input-single-output OR gate 1130. The AND gate 1110_i performs a logic AND function on the value of the register 930_j_i of the intermediary register 930_j and the value of the register 370_i of the mask register 370, and outputs the AND result to the register 370_i for latching the AND result, as well as the multi-input-single-output OR gate 1130, where i represents an arbitrary integer ranging from 0 to 255 and j represents an arbitrary integer ranging from 1 to 4. The multi-in-single-out OR gate 1130 may include OR gates organized in a tree-like structure, performs a logic OR function on the outputs of the AND gates 1110_0 to 1110_255 and outputs the result to the outcome register 383. When at least one input is "2'b1", the multi-in-single-out OR gate 1130 outputs "2'b1". When all inputs are "2'b0", the multi-in-single-out OR gate 1130 outputs "2'b0".

Figure 11A:
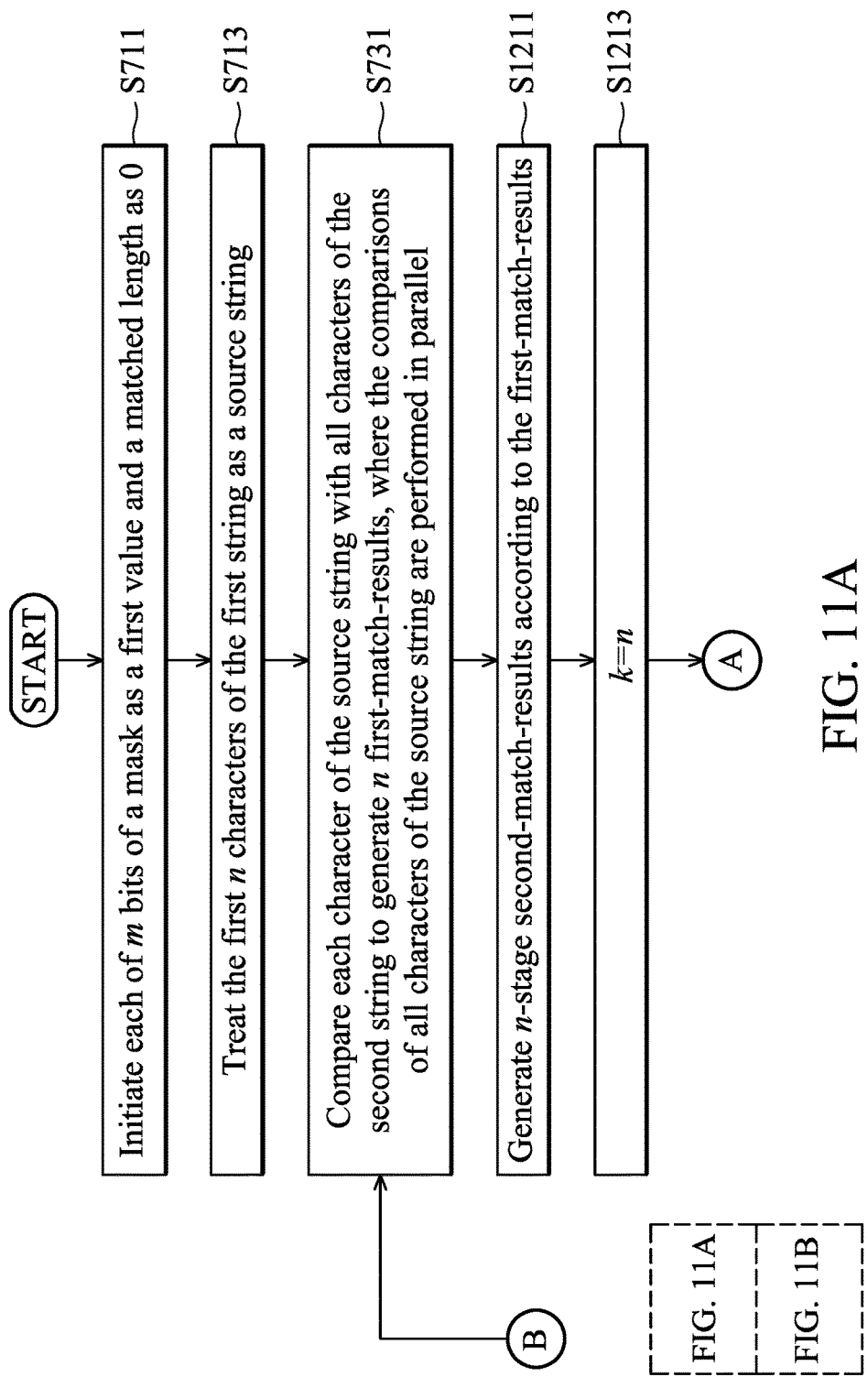
FIGS. 11A-11B are flowcharts of a method for accelerating compression according to an embodiment of the invention.
Figure 11B:
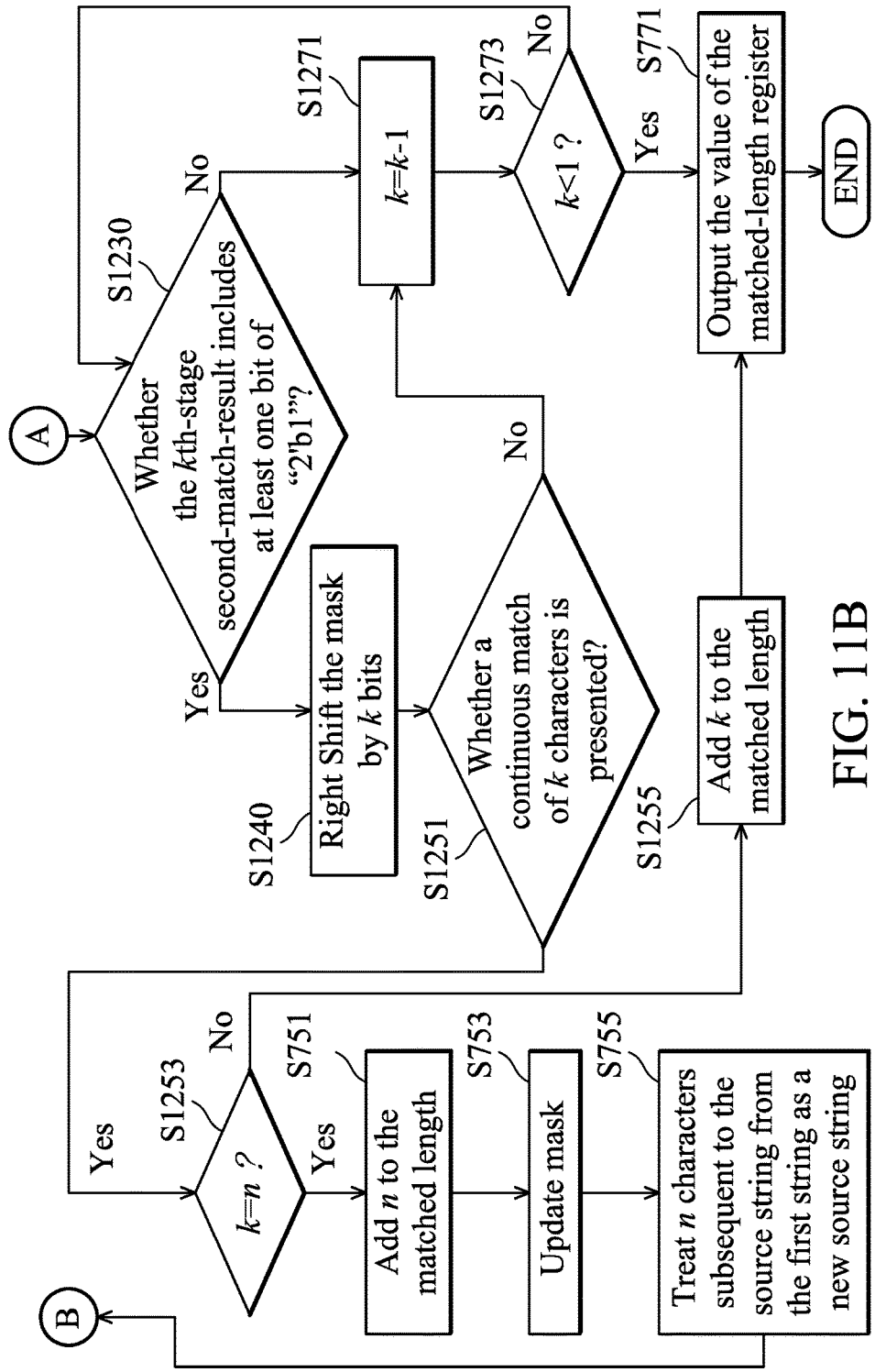

FIGS. 11A-11B are flowcharts of a method for accelerating compression according to an embodiment of the invention. The method is executed by using the compression accelerator 20 as shown in FIGS. 8A and 8B for obtaining the longest matched-length between two strings (i.e., a first string and a second string). Each of m bits of a mask is initiated as a first value, such as "2'b1", and a matched length is initiated as 0, where m may be 256 (step S711) and the first n characters of the first string are treated as a source string (step S713). The initial mask may be latched in the mask register 370, the initial matched length may be latched in the matched-length register 393 and the source string may be latched in the lookahead buffer 320. Subsequently, an outer loop is repeatedly executed to obtain the longest matched-length between the first and second strings (including steps S731 to S771 and steps S1211 to S1273). In each iteration of the outer loop, specifically, each character of the source string is compared with all characters of the second string to generate n first-match-results corresponding to the n characters of the source string respectively (step S731). In an embodiment, the n comparisons of step S731 may be performed in parallel. Subsequently, n-stage second-match-results are generated according to the first-match-results and each stage of the second-match-result stores information indicating whether the whole or a portion of the source string is included in the second string (step S1211), k is set to n (step S1213) and an inner loop is repeatedly executed (including steps S771 and steps S1230 to S1273). The second string may be latched in the sliding window buffer 310. Step S731 may be realized by using the string comparators 330_1 to 330_4 and the first-match-results may be latched in the match registers 340_1 to 340_4. Step S1211 may be realized by using the four-stage shifter-and-comparators 910_1 to 910_4 and the second-match-results of four stages may be latched in the intermediary registers 930_1 to 930_4. In each iteration of the inner loop, it is determined whether the $k^{th}$-stage second-match-result includes at least one bit of "2'b1" (step S1230). When the $k^{th}$-stage second-match-result includes at least one bit of "2'b 1" (the "Yes" path of step S1230), the mask is right shifted by k bits to indicate that a position sequentially next to the ending position at which the continuous match is expected to end in this iteration (step S1240) and the shifted mask is applied to the $k^{th}$-stage second-match-result to determine whether a continuous match of k characters is presented (step S1251). Step S1240 may be realized by using the aforementioned controller 950. Step S1251 may be realized by using the aforementioned outcome inspector 973 and the determination result may be latched in the outcome register 383. When a continuous match of k characters is presented (the "Yes" path of step S1251), it is determined whether k equals n (step S1253). A continuous match of k characters being absent (the "No" path of step S1251) means that the k characters matched in this iteration of inner-loop does not form a continuous match with the n characters matched in the prior outer-loop, the process proceeds to step S1271. When k equals n (the "Yes" path of step S1253), n is added to the matched length (step S751), the mask latched in the mask register 370 is updated with the applied result generated in step S1251 (step S753), and n characters subsequent to the source string from the first string are treated as a new source string (step S755). k being equaled to n means that all n source characters in this iteration are matched and the process goes back to step S731 to execute the outer loop of the next iteration to conduct another forward longest match. Steps S751 and S755 may be realized by using the controller 391. When k does not equal n (the "No" path of step S1253), k is added to the matched length (step S1255) and the matched length is output (step S771). When the $k^{th}$-stage second-match-result does not include at least one bit of "2'b1" (the "No" path of step S1230), k is decreased by 1 (step S1271) and it is determined whether k is less than 1 (step S1273). When k is less than 1 (the "Yes" path of step S1273), the matched length is output (step S771). When k is not less than 1 (the "No" path of step S1273), the inner loop of the next iteration is executed (goes back to step S1230). It should be noted that, in an embodiment, steps S1230 and S1251 of the inner loop for inspecting the $k^{th}$-stage second-match-result may be realized by parallel hardware, that is, inspecting whether the four-stage second-match-results includes at least one bit of "2'b1" can be performed in parallel of inspecting whether the position of "2'b1" indicates a continuous match of k characters matched in this iteration with the former n characters matched in the last iteration. Thereafter, k updated in step S1255 is output. In addition, in some embodiments, step S1240 for right shifting the mask by k bits may be replaced with other methods applied to determine whether a continuous match of k characters matched in this iteration with the former n characters matched in the last iteration is presented.

Figure 12:
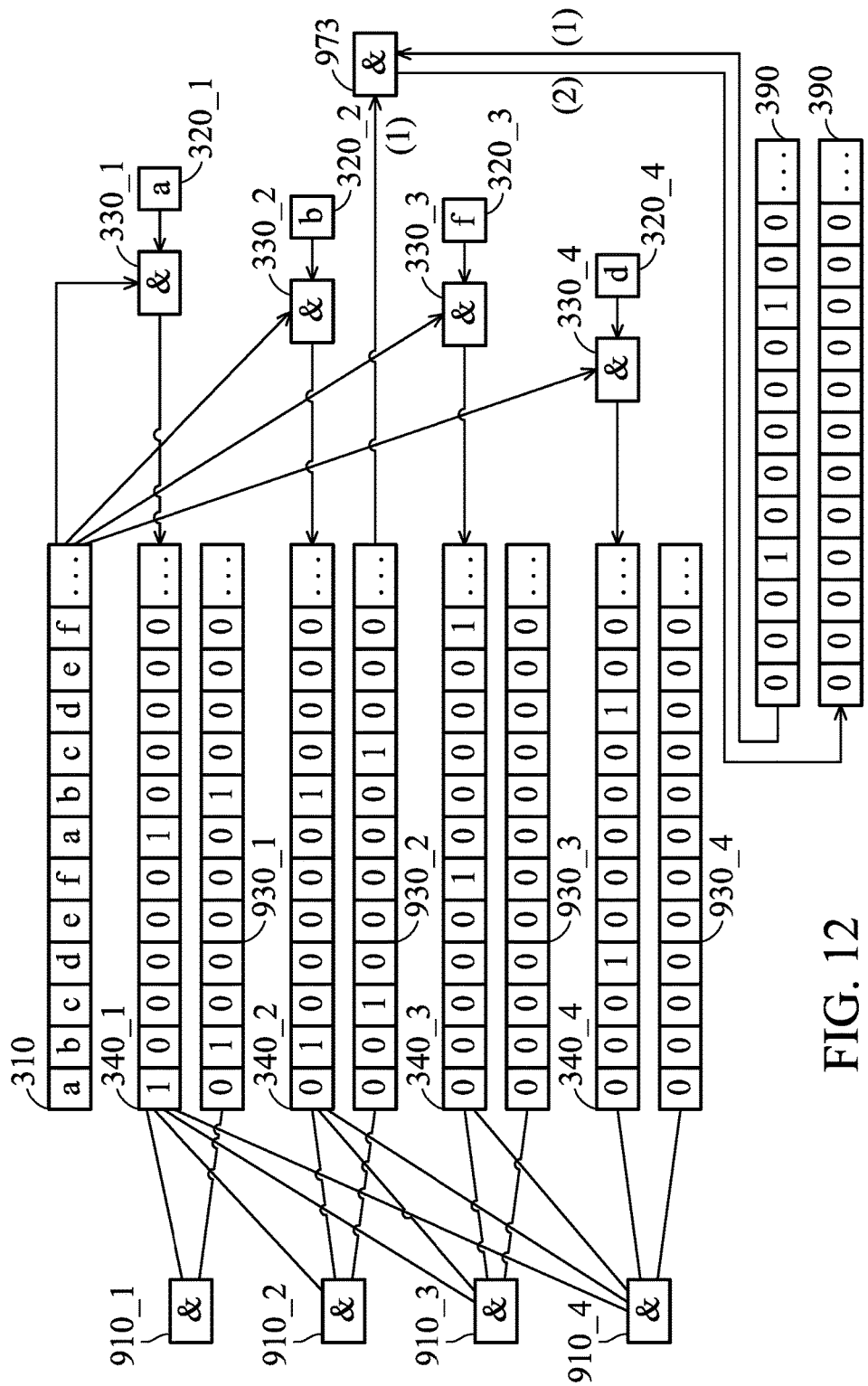
FIG. 12 is a schematic diagram for calculating a LSM according to an embodiment of the invention.

The following examples are introduced to describe the compression accelerator as shown in FIGS. 8A-8B and the method for accelerating compression as shown in FIGS. 11A-11B. FIG. 12 is a schematic diagram for calculating a LSM according to an embodiment of the invention. Assume that a first string includes at least characters "a", "b", "f" and "d" and a second string includes at least characters "a", "b", "c", "d", "e", "f", "a", "b", "c", "d", "e" and "f": Each of m bits of a mask is initiated as "2'b1" and a matched length is initiated as 0 (step S711) and the characters "a", "b", "f" and "d" of the first string are treated as a source string and are latched in the registers 320_1 to 320_4, respectively (step S713). Subsequently, each character of the source string is compared with all characters of the second string to generate 4 first-match-results (step S731). Specifically, the string comparator 330_1 compares the source character "a" with all characters of the second string, generates a first-match-result "2'b100000100000 . . . " and directs the match register 340_1 to latch the first-match-result. The string comparator 330_2 compares the source character "b" with all characters of the second string, generates a first-match-result "2'b010000010000 . . . " and directs the match register 340_2 to latch the first-match-result. The string comparator 330_3 compares the source character "f" with all characters of the second string, generates a first-match-result "2'b000001000001 . . . " and directs the match register 340_3 to latch the first-match-result. The string comparator 330_4 compares the source character "d" with all characters of the second string, generates a first-match-result "2'b000100000100 . . . " and directs the match register 340_4 to latch the first-match-result. Subsequently, the shifter-and-comparator 910 generates n-stage second-match-results according to the first-match-results (step S1211). Specifically, the shifter-and-comparator 910_1 performs a bitwise logic AND function according to the shifted values of the match register 340_1 and latches the calculation result "2'b010000010000 . . . " in the registers 930_1_0 to 930_1_(m−1) of the intermediary register 930_1 as the $1^{st}$-stage second-match-result. The shifter-and-comparator 910_2 performs a bitwise logic AND function according to the shifted values of the match registers 340_1-340_2, and latches the calculation result "2'b001000001000 . . . " in the registers 930_2_0 to 930_2_(m−1) of the intermediary register 930_2 as the $2^{nd}$-stage second-match-result. The shifter-and-comparator 910_3 performs a bitwise logic AND function according to the shifted values of the match registers 340_1-340_3, and latches the calculation result "2'b000000000000 . . . " in the registers 930_3_0 to 930_3_(m−1) of the intermediary register 930_3 as the $3^{rd}$-stage second-match-result. The shifter-and-comparator 910_4 performs a bitwise logic AND function according to the shifted values of the match registers 340_1-340_4, and latches the calculation result "2'b000000000000 . . . " in the registers 930_4_0 to 930_4_(m−1) of the intermediary register 930_4 as the $4^{th}$-stage second-match-result. Since the $4^{th}$-stage second-match-result and the 3rd-stage second-match-result do not include any bit of "2'b1" but the $2^{nd}$-stage second-match-result includes at least one bit of "2'b1" (step S1230), a mask is right shifted by 2 bits as "2'b0011111111 . . . " to indicate that a position sequentially next to the ending position at which the continuous match is expected to end in this iteration is the $3^{rd}$ position (step S735), the mask is applied to the second-match-result and the applied result "2'b001000001000 . . . " in the mask register 370 and whether the applied result includes any bit of "2'b1" is determined (that is, whether a continuous match of 2 characters is presented) (step S1251). Since the applied result "2'b001000001000 . . . " includes at least one bit of "2'b1" (the "Yes" path of step S737), the controller 391 updates the value of the matched-length register 393 with 2=0+2 (step S1255) and outputs the value of the matched-length register 393 (step S771). It should be understood that the compression accelerator as shown in FIGS. 8A-8B with the method for accelerating compression as shown in FIGS. 11A-11B can output a matched length of an arbitrary number.

Figure 13:
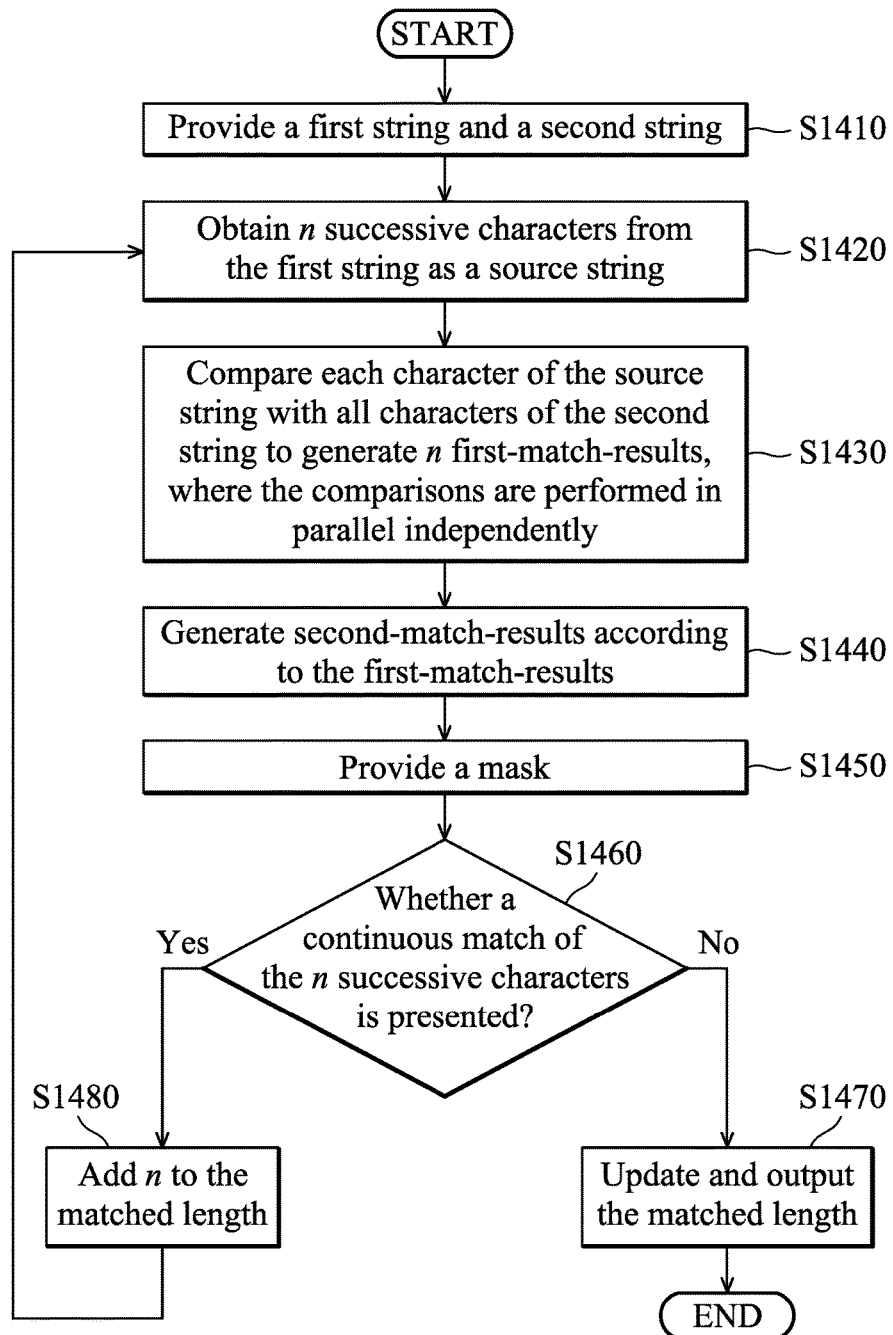
FIG. 13 is a flowchart of a method for accelerating compression according to an embodiment of the invention.

FIG. 13 is a flowchart of a method for accelerating compression according to an embodiment of the invention. The method is executed by using the compression accelerator 20 as shown in FIG. 2 or FIGS. 8A-8B. The method initially provides a first string and a second string (step S1410) and repeatedly executes a loop for determining the longest matched-length between the first and second strings (steps S1420 to S1480). In each iteration of the loop, n successive characters are obtained from the first string as a source string, where, except for the first iteration, the n successive characters are appended to the source string calculated in the last iteration (step S1420); each character of the source string is compared with all characters of the second string, also referred to as a vertical comparison, so as to generate n first-match-results corresponding to the n successive characters of the source string respectively, where the comparisons are performed in parallel independently (step S1430); second-match-results are generated according to the first-match-results (step S1440); a mask is provided (step S1450); and it is determined whether a continuous match of the n successive characters is presented according to the second-match-results (step S1460). When the continuous match of the n successive characters is not presented (the "No" path of step S1460), the matched length is updated and output (step S1470), and the loop is broken. When the continuous match of the n successive characters is presented (the "Yes" path of step S1460), n is added to the matched length (step S1480) and the next iteration of the loop is executed. Persons seeking details of step S1420 may refer to the description of steps S713 and S755. Persons seeking details of step S1430 may refer to the description of step S731. It should be understood that the parallel comparisons realized in dedicated hardware are faster than comparisons realized in software. Persons seeking details of step S1440 may refer to the description of step S733 or S1211. Persons seeking details of step S1450 may refer to the description of step S735. Persons seeking details of step S1460 may refer to the description of step S737 or S1251. Persons seeking details of step S1470 may refer to the description of step S771 or S1255. Persons seeking details of step S1480 may refer to the description of step S751.

Although the embodiments have been described as having specific elements in FIGS. 1-5 and 8-10, it should be noted that additional elements may be included to achieve better performance without departing from the spirit of the invention. While the process flows described in FIGS. 6, 11A-11B and 13 include a number of operations that appear to occur in a specific order, it should be apparent that those skilled in the art can modify the order to achieve the same objectives. Thus, the invention should not be limited to the specific order.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for accelerating compression, performed in a compression accelerator, comprising:
repeatedly executing a loop for determining a longest matched-length between a first string and a second string,
wherein each iteration of the loop comprises:
obtaining n successive characters from the first string as a source string, wherein n is greater than 1;
comparing each character of the source string with all characters of the second string, so as to generate n first-match-results corresponding to the n successive characters of the source string respectively;
generating a second-match-result according to the n first-match-results;
determining whether a continuous match of the n successive characters is presented according to the second-match-result;
when the continuous match of the n successive characters is not presented, updating and outputting a matched length and breaking the loop; and
when the continuous match of the n successive characters is presented, adding n to the matched length and continuing to execute the next iteration of the loop.

2. The method of claim 1, wherein each of the first-match-results comprises m bits, the $i^{th}$ bit of each first-match-result being a first value indicates that the $i^{th}$ character of the second string matches a corresponding character of the source string, and the $i^{th}$ bit of each first-match-result being a second value indicates that the $i^{th}$ character of the second string does not match a corresponding character of the source string.

3. The method of claim 1, wherein, except for a first iteration, the n successive characters are appended to the source string calculated in the last iteration.

4. The method of claim 1, wherein a mask is applied to the second-match-result to determine whether the continuous match of the n successive characters is presented, and the mask indicates a position sequentially next to an ending position at which the continuous match is expected to end.

5. The method of claim 4, wherein, when $(t+1)^{th}$ bit of the second-match-result and $(t+1)^{th}$ bit of the mask are both at a first value, it is determined that the continuous match of the n successive characters is presented, and t is a multiple of n.

6. The method of claim 1, wherein the second-match-result comprises m bits, $j^{th}$ bit of the second-match-result being a first value indicates that $(j-n)^{th}$ to $(j-1)^{th}$ characters of the second string match characters of the source string, and j is an arbitrary integer between n and (m−1).

7. The method of claim 1, wherein the step of updating and outputting the matched length comprises:
adding p to the matched length, wherein p is an arbitrary integer between 1 and (n−1).

8. The method of claim 7, wherein the second-match-result comprises a $1^{st}$-stage second-match-result to an $n^{th}$-stage second-match-result, each stage of the second-match-result comprises m bits, and an $i^{th}$ bit of the $p^{th}$-stage second-match-result being a first value indicates that $(i-p)^{th}$ to $(i-1)^{th}$ characters of the second string match top p characters of the source string, and p is an arbitrary integer between 1 and n.

9. The method of claim 8, wherein the step of updating and outputting the matched length comprises:
repeatedly executing a second loop for inspecting the $(n-1)^{th}$-stage second-match-result to the $1^{st}$-stage second-match-result, so as to determine p,
wherein each iteration of the second loop comprises:
when the $k^{th}$-stage second-match-result comprises the first value, right shifting a mask by k bits, wherein k is an arbitrary integer between 1 to (n−1); and
when a result generated by a logic AND function on the shifted mask and the $k^{th}$-stage second-match-result indicates that a continuous match of k successive characters is presented, p=k.

10. The method of claim 1, comprising:
when the continuous match of the n successive characters is presented, updating a mask with a result of applying the mask to the second-match-result.

11. An apparatus for accelerating compression, comprising:
a sliding window buffer, latching a second string;
a lookahead buffer, latching n successive characters from the first string as a source string;
n string comparators, comparing each character of the source string with all characters of the second string, so as to generate n first-match-results corresponding to the n successive characters of the source string respectively, wherein n is greater than 1;
a shifter-and-comparator, generating a second-match-result according to the n first-match-results;
an outcome inspector, determining whether a continuous match of the n successive characters is presented according to the second-match-result; and
a controller, updating and outputting a matched length when the continuous match of the n successive characters is not presented, and adding n to the matched length and controlling the lookahead buffer to latch the next successive n characters from the first string as a new source string when the continuous match of the n successive characters is presented.

12. The apparatus of claim 11, wherein each of the first-match-results comprises m bits, the $i^{th}$ bit of each first-match-result being a first value indicates that the $i^{th}$ character of the second string matches a corresponding character of the source string, and the $i^{th}$ bit of each first-match-result being a second value indicates that the $i^{th}$ character of the second string does not match a corresponding character of the source string.

13. The apparatus of claim 11, wherein the second-match-result stores information indicating whether the source string is entirely or partially included in the second string.

14. The apparatus of claim 11, wherein a mask is applied to the second-match-result to determine whether the continuous match of the n successive characters is presented, and the mask indicates a position sequentially next to an ending position at which the continuous match is expected to end.

15. The apparatus of claim 14, wherein, when $(t+1)^{th}$ bit of the second-match-result and $(t+1)^{th}$ bit of the mask are both first values, the outcome inspector determines that the continuous match of the n successive characters is presented, and t is a multiple of n.

16. The apparatus of claim 11, wherein the second-match-result comprises m bits, the shifter-and-comparator comprises a plurality of AND gates for determining a value of $j^{th}$ bit of the second-match-result according to values of corresponding bit of the n first-match-results, wherein the $j^{th}$ bit of the second-match-result being the a first value indicates that $(j-n)^{th}$ to $(j-1)^{th}$ characters of the second string match characters of the source string, and j is an arbitrary integer between n and (m−1).

17. The apparatus of claim 11, wherein the controller adds p to the matched length when the continuous match of the n successive characters is not presented, and p is an arbitrary integer between 1 and (n−1).

18. The apparatus of claim 17, wherein the second-match-result comprises a $1^{st}$-stage second-match-result to an $n^{th}$-stage second-match-result, each stage of the second-match-result comprises m bits, and an $i^{th}$ bit of the $p^{th}$-stage second-match-result being a first value indicates that $(i-p)^{th}$ to $(i-1)^{th}$ characters of the second string match top p characters of the source string, and p is an arbitrary integer between 1 and n.

19. The apparatus of claim 18, wherein the controller repeatedly executes a loop for inspecting the $(n-1)^{th}$-stage second-match-result to the $1^{st}$-stage second-match-result, so as to determine p, wherein each iteration of the loop comprises:
when the $k^{th}$-stage second-match-result comprises the first value, right shifting a mask by k bits, wherein k is an arbitrary integer between 1 to (n−1); and
when a result generated by a logic AND function on the shifted mask and the $k^{th}$-stage second-match-result indicates that a continuous match of k successive characters is presented, p=k.

20. The apparatus of claim 11, wherein the sliding window buffer, the lookahead buffer, the n string comparators, the shifter-and-comparator, the outcome inspector and the controller are disposed in a compression accelerator and the compression accelerator is disposed outside of a processor core.

* * * * *